United States Patent
Galli et al.

(10) Patent No.: US 6,859,087 B2
(45) Date of Patent: Feb. 22, 2005

(54) HALF-BRIDGE HIGH VOLTAGE GATE DRIVER PROVIDING PROTECTION OF A TRANSISTOR

(75) Inventors: Giovanni Galli, Manhattan Beach, CA (US); Marco Giandalia, Palermo (IT); Andrea Merello, Arese (IT)

(73) Assignee: International Rectifier Corporation, El Segundo, CA (US)

(*) Notice: Subject to any disclaimer, the term of this patent is extended or adjusted under 35 U.S.C. 154(b) by 0 days.

(21) Appl. No.: 10/696,711

(22) Filed: Oct. 29, 2003

(65) Prior Publication Data

US 2004/0120090 A1 Jun. 24, 2004

Related U.S. Application Data

(60) Provisional application No. 60/423,496, filed on Oct. 31, 2002.

(51) Int. Cl.[7] ................................................. H03K 3/00
(52) U.S. Cl. ........................ 327/423; 327/310; 327/312; 327/382
(58) Field of Search ......................... 327/108–112, 434, 327/436, 437, 423, 310, 379–382, 588, 312

(56) References Cited

U.S. PATENT DOCUMENTS 6,473,320 B2 * 10/2002 Randazzo ................. 363/56.02

* cited by examiner

Primary Examiner—Kenneth B. Wells
(74) Attorney, Agent, or Firm—Ostrolenk, Faber, Gerb & Soffen, LLP

(57) ABSTRACT

A gate drive integrated circuit for switching power transistors using an external controller includes a gate driving capability and low quiescent current and allows use of a bootstrap supply technique for providing the logic supply voltage. The gate driver integrated circuit detects power transistor desaturation, protecting a desaturated transistor from transient over voltages by smoothly turning off the desaturated transistor via a soft shutdown sequence. A fault control circuit of the gate driver integrated circuit manages protection of supply under-voltage and transistor desaturation and is capable of communicating with a plurality of gate driver integrated circuits in a multi-phase system using a dedicated local network.

35 Claims, 18 Drawing Sheets

HALF-BRIDGE HIGH VOLTAGE GATE DRIVER PROVIDING PROTECTION OF A TRANSISTOR

This application claims the benefit of U.S. Provisional Application No. 60/423,496, filed Oct. 31, 2002, entitled "Half-Bridge High Voltage Monolithic Gate Driver Providing Full Protection of Power Transistor and Diagnostic Feedback," which is incorporated by reference herein in its entirety.

BACKGROUND OF THE INVENTION

1. Field of the Invention

The field of the invention is gate drivers for metal oxide silicon field effect transistors, especially gate drivers providing full protection and diagnostic feedback.

2. Background of the Invention

Metal oxide semiconductor field effect transistors (MOSFETs) have been used in power electronics applications for their ability to carry large currents and to block high off-state voltages, while having comparatively low on-state voltage drops across the transistor. Generally, there are two parasitic capacitances between the gate to source and the gate to drain that may cause switching delays if the gate driver does not support large initial currents.

Conventional MOSFET gate driver circuits are simple, self-design circuits. More complex integrated circuit gate drivers are known that are controlled directly from transistor-transistor logic, complementary metal oxides semiconductors and microprocessor logic circuits. If the integrated driver circuit does not provide floating isolation, it is necessary to include a floating power supply.

SUMMARY OF THE INVENTION

A gate driver integrated circuit for switching one or more power transistors uses an external supply voltage and an external controller. The integrated circuit comprises an output stage for each of the power transistors, an input stage and a fault control circuit integrated in the integrated circuit. In operation, the output stage is coupled to the power transistor, such that a desaturation state of the power transistor may be detected, allowing a soft shutdown sequence to be executed, gradually shutting down the power transistor. Thus, transient over-voltages are prevented. The input stage is coupled to the output stages and may be coupled to the external controller, which provides an external control input for each power transistor. The input stage is configured to control the output stage as a function of the external control inputs during normal operation.

The fault control circuit is coupled to the output stage and the input stage. The fault control circuit operates to place the input stage in a hold state during the soft shutdown sequence of one or more of the output stages, causing the input stage to ignore the external control inputs from the external controller during the soft shutdown sequence. Thus, the output stages are not switched on/off by the external controller (freeze) during the soft shutdown sequence. After soft shutdown sequences are completed by the output stages, the fault control circuit may initiate a hard shutdown. The fault control circuit may also manage fault control signals with external devices, such as the external controller and other gate driver integrated circuits, connected in a network of devices, for example. Thus, the fault control circuit may insure that desaturation protection takes priority over under-voltage protection and normal operation of the output stages.

The gate driver integrated circuit is operably designed to drive a single half-bridge in power switching applications, including a gate driving capability and low quiescent current, which enables bootstrap supply techniques in power systems. The gate driver comprises full short circuit protection by detecting power transistor desaturation. Half-bridge voltage is managed by smoothly turning off the desaturated transistor via a dedicated soft shutdown sequence, preventing transient over-voltages and reducing electromagnetic emissions.

In one embodiment, a multi-phase system of gate drivers communicate using a dedicated local network of electronic signals to manage phase to phase short circuits. For example, a system controller may force shutdown or a read device fault state by way of a 3.3 volt compatible CMOS input/output pin. Diagnostic feedback is enabled to improve signal immunity from the direct current bus noise. For example, both the control and power ground use dedicated pins enabling the low side emitter current to be sensed, and under-voltage states are independently managed in high side and low side driving circuits. The low side driving circuit is referenced to ground, and the high side driving circuit is capable of floating to a high voltage. Thus, an independent floating power supply is not required. For example, the external controller is capable of asserting control inputs HIN, LIN, which switch the gate drivers on and off during normal operation.

One advantage of a gate driver integrated circuit according to one embodiment of the present invention is that the output stages are able to turn on quickly with high current output, while being protected dynamically. Another advantage is that a bootstrap voltage is capable of supplying the high side driver circuitry by a bootstrap diode and bootstrap capacitor. Yet another advantage is that a multiphase system of gate drivers may be comprised of one gate driver integrated circuit per phase of the multiphase system using a common, dedicated local network of fault signals to coordinate fault protection of the multiphase system, such as desaturation and under-voltage fault protection.

Other features and advantages of the present invention will become apparent from the following description of the invention which refers to the accompanying drawings.

Other features and advantages of the present invention will become apparent from the following description of the invention which refers to the accompanying drawings.

DETAILED DESCRIPTION

Figure 2:
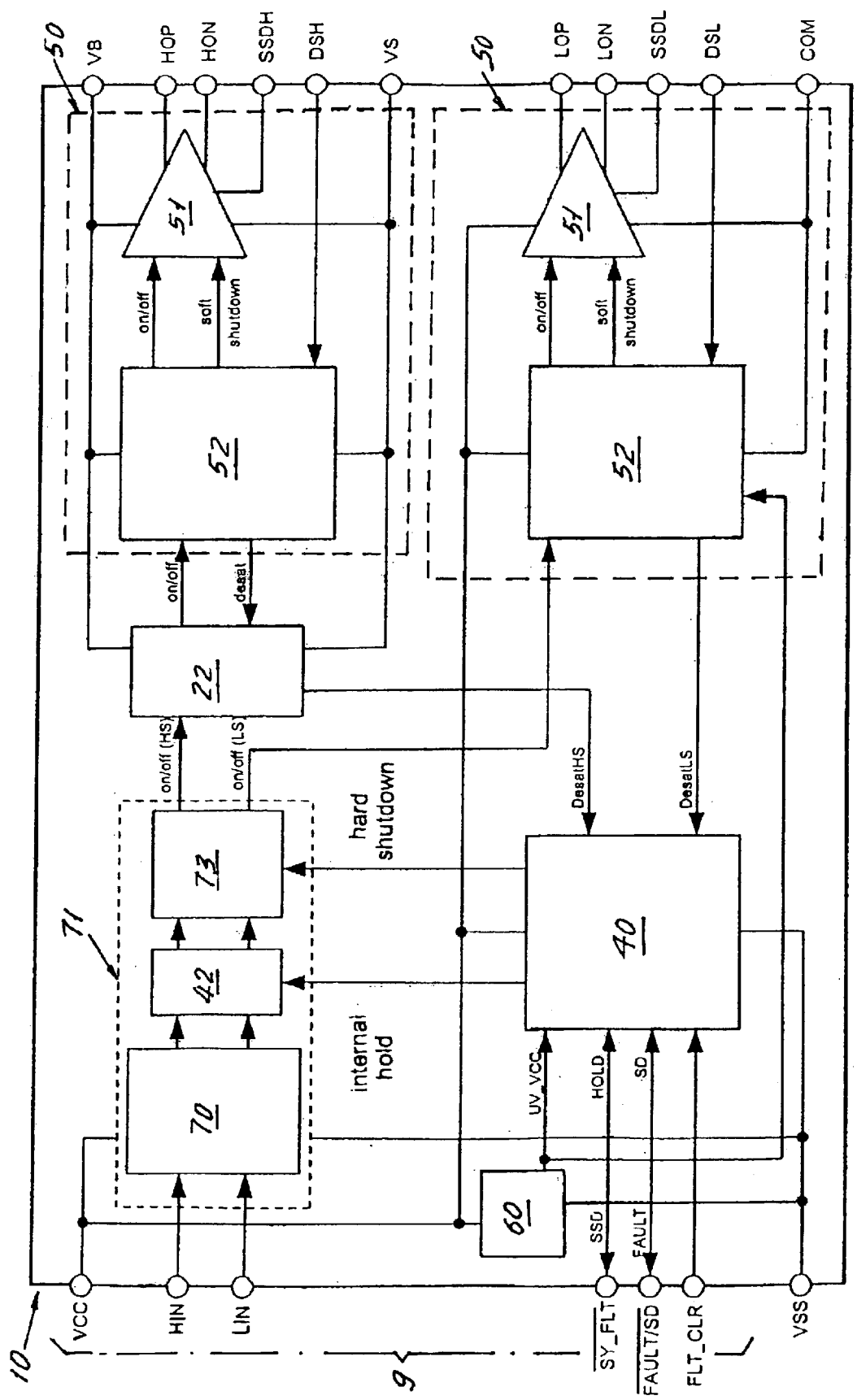
FIG. 2 illustrates a functional block diagram of the gate driver integrated circuit shown in FIG. 1.

One embodiment of a gate driver integrated circuit 10 for driving and protecting an insulating gate bipolar transistor 110 comprises an input control stage 70, a hold logic stage 42, a switching logic stage 73, at least one gate driver output stage 50 and a fault control circuit 40. For example, the gate driver integrated circuit 10 has circuits integrated as shown in FIG. 2. The input control stage 70 is electrically connected to at least one external control input capable of connecting to an external controller. The input stage 70 has at least one control output to the hold logic circuit 42, which has at least one internal hold output and an internal connection to the fault control circuit 40 for activating a hold state (freeze), causing any changes in the signals from the input stage 70 to be ignored. The hold output is received by the switching logic stage 73, which has at least one switching output to each of the output stages 50 of the integrated circuit 10. The switching logic stage is also connected to the fault control circuit 40, receiving a shutdown control signal from the fault control circuit 40. For example, activation of the shutdown control signal by the fault control circuit 40 causes an immediate, hard shutdown of all of the output stages 50 in the integrated circuit 10.

Figure 5:
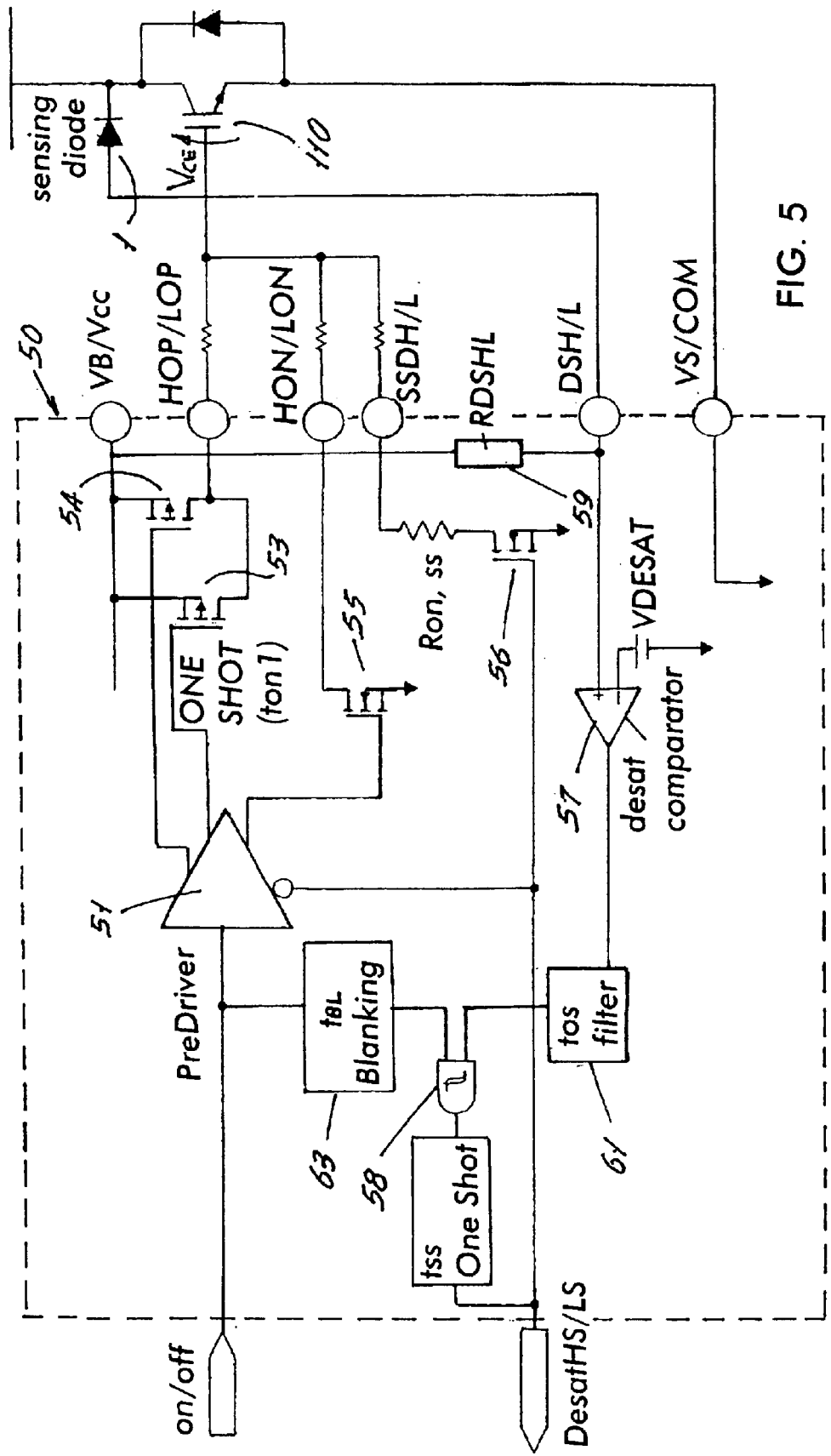
FIG. 5 illustrates one embodiment of the structure of a desaturation sensing and soft shutdown circuit of FIG. 2.

In one embodiment, at least one output stage 50 is capable of being to an external voltage $V_{BS}$, $V_{CC}$ and an external desaturation voltage sensing diode 1, 2. For example, as shown in FIG. 5, each gate driver output stage 50 comprises a predriver 51 and protection circuitry 52, as shown in FIG. 2. In one example, the predriver 51 is integrated with the protection circuitry 52 as shown in FIG. 5. The gate driver output stage 50 has a driver sourcing output $V_{HOP}$, $V_{LOP}$, a driver sinking output $V_{HON}$, $V_{LON}$, a desaturation voltage sensing circuit 56, 57, 58, 59, 61, 63 and DSH/L and a desaturation protection output $V_{SSDH}$.

Figure 6:
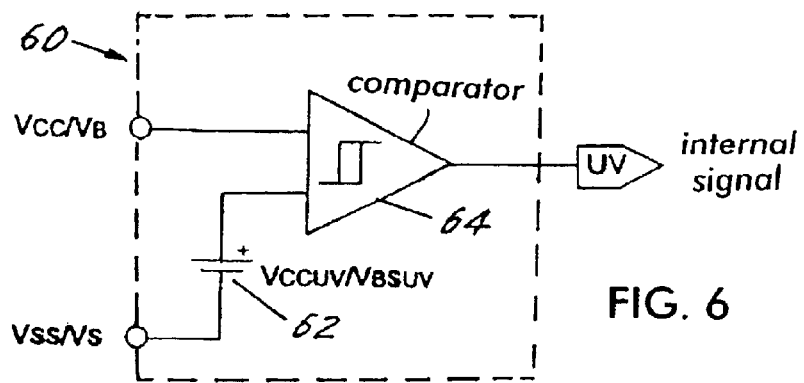
FIG. 6 shows one embodiment of the under-voltage circuit 60 of FIG. 2.

In one example, a logic supply voltage failure is detected by an under-voltage detection circuit 60, such as the under-voltage detection circuit shown in FIG. 6. If a supply voltage under-voltage failure is detected by the detection circuit 60, the fault control circuit 40 disables the output stages 50, providing under-voltage protection. In one embodiment, an under-voltage event of the logic supply voltage $V_{CC}$ disables both the low side and high side output stages 50. For example, under-voltage detection generates a diagnostic signal by forcing a dual function input/output pin FAULT/SD active low. In this example, the fault state is not latched and the dual function input/output pin FAULT/SD is released when the logic supply voltage $V_{CC}$ is no longer in an under-voltage state.

In another example, during an under-voltage state of the high side gate driver floating supply $V_{BS}$, a high side under-voltage protection circuit in the protection circuitry 52 disables only the high side output stage 50 latching the output stage 50 off, but allowing the low side output stage to switch the low side transistor 7 or to generate diagnostic signals. For example, the high side remains latched until external control input HIN is received from the external controller.

Desaturation protection of the gate driver integrated circuit 10 protects a power transistor, such as an insulating gate bipolar transistor 110, from transient voltages during transistor switch-off. For example, a phase and/or a rail supply short circuit induce overload states that may cause a transistor failure. For example, inducing large current increases in an insulating gate bipolar transistor, may cause the transistor to desaturate, which may be detected as an increase of the emitter to collector voltage $V_{CE}$. The current in a power transistor in a desaturated state may be as high as ten times the nominal current, for example. Thus, when the transistor is switched off, the high current may generate a high voltage transient in the output stage. The high current should be reduced to protect against over-voltage states. In one example, a gate driver integrated circuit protects against over voltage states by smoothly and gradually turning off the desaturated transistor using a soft shutdown sequence, using the SSD H/L connection of FIG. 5, for example. An external sensing diode 1, 2 has a voltage rating greater than the maximum supply voltage and a low stray capacitance such that noise coupling and switching delays are reduced. The sensing diode 1, 2 is biased by an internal pull up resistor 59, as shown in FIG. 5. For example, the internal pull up resistor 59 should equal the quotient of the voltage $V_{CC}$, $V_{BS}$ across the transistor 6, 7 and the low input bias current $I_{DS}$.

Figure 4:
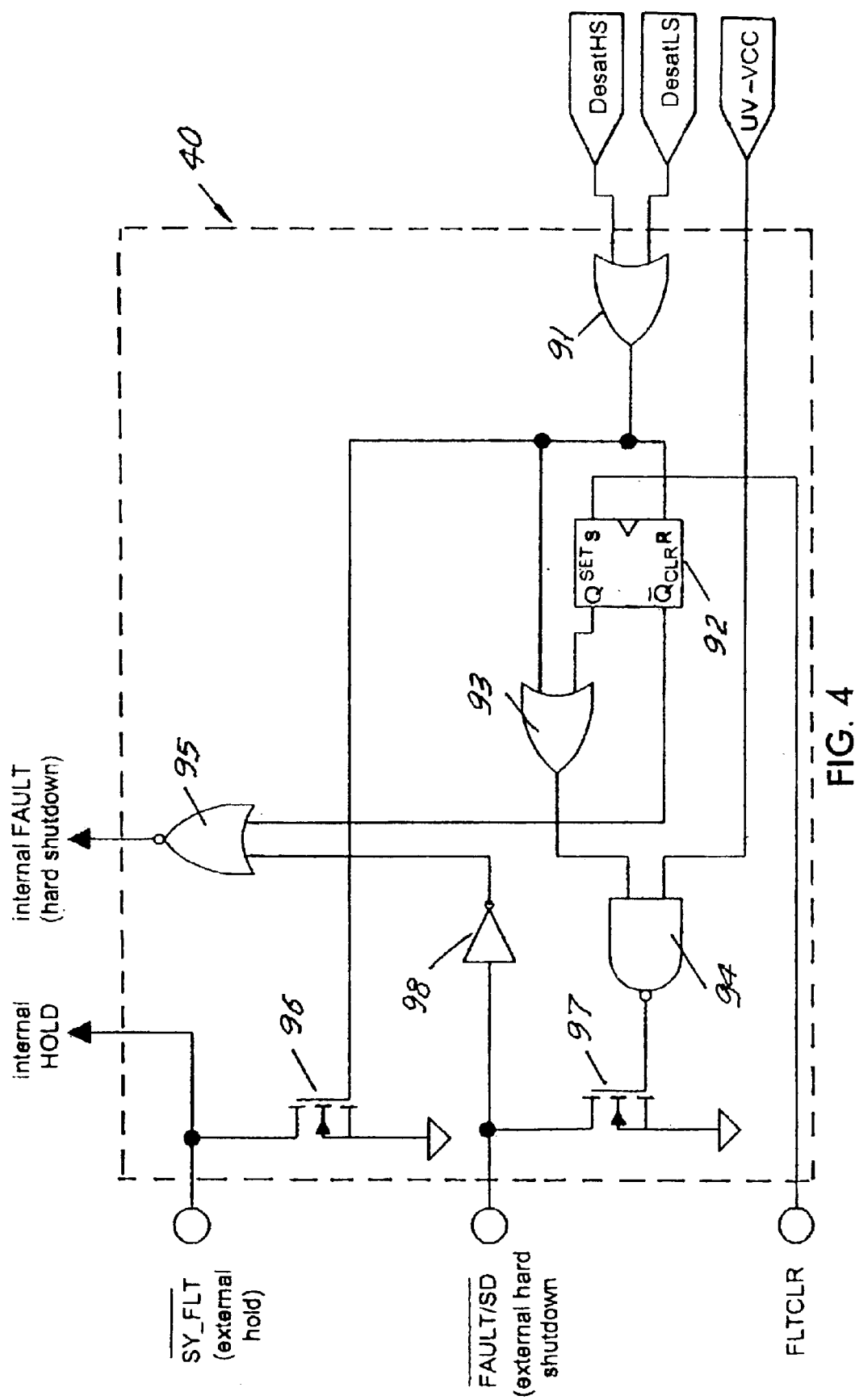
FIG. 4 shows one embodiment of the fault management circuit 40 of FIG. 2.

FIG. 5 shows one structure for desaturation sensing and soft shutdown. For example, the switching control signal is received by the output stage 50 either directly from the shutdown logic circuit 73 or via a level shifter 22, as shown in FIG. 2. The desaturation signal DESAT HS/LS is provided to the fault control circuit 40, which helps to control the hold logic 42 and the shutdown logic circuit 73, as shown in FIGS. 2 and 4. For example, the configuration of the desaturation sensing and soft shutdown circuitry for the high and low side output stages 50 may be the same.

In one embodiment, the high and low desaturation voltages $V_{DSH}$, $V_{DSL}$ are automatically clamped by being internally biased to the local supply. When the emitter to collector voltage $V_{CE}$ increases, the voltage at the desaturation pin $V_{DSH}$, $V_{DSL}$ increases also. When $V_{DSH}$ or $V_{DSL}$ exceeds a threshold voltage $V_{DSAT}$, the desaturation comparator 57 triggers, which may initiate a soft shutdown sequence. For example, the comparator output is filtered to avoid desaturation fault detection erroneously induced by external noise. In one example, noise that has a pulse length shorter than a threshold time is filtered. In another example, the desaturation circuit is disabled by a blanking signal 63, preventing any desaturation detection by transients during transistor turn-on. An example of propagation and timing delays of one embodiment is shown in Table VI.

In one embodiment, the fault control circuit 40 asserts an external hold by asserting an external desaturation fault output SY_FLT during a soft shutdown. Thus, an external dedicated local network reports the soft shutdown state during the entire soft shutdown sequence to other devices connected to the network. After soft shutdown is complete, the external hold signal SY_FLT is released, and an external hard shutdown signal FAULT/SD may be asserted, generating a hard shutdown of all the output stages. After a hard shutdown, each output stage may be latched low until the fault is cleared, such as by raising the voltage at the fault clear connector FLTCLR.

Figure 19:
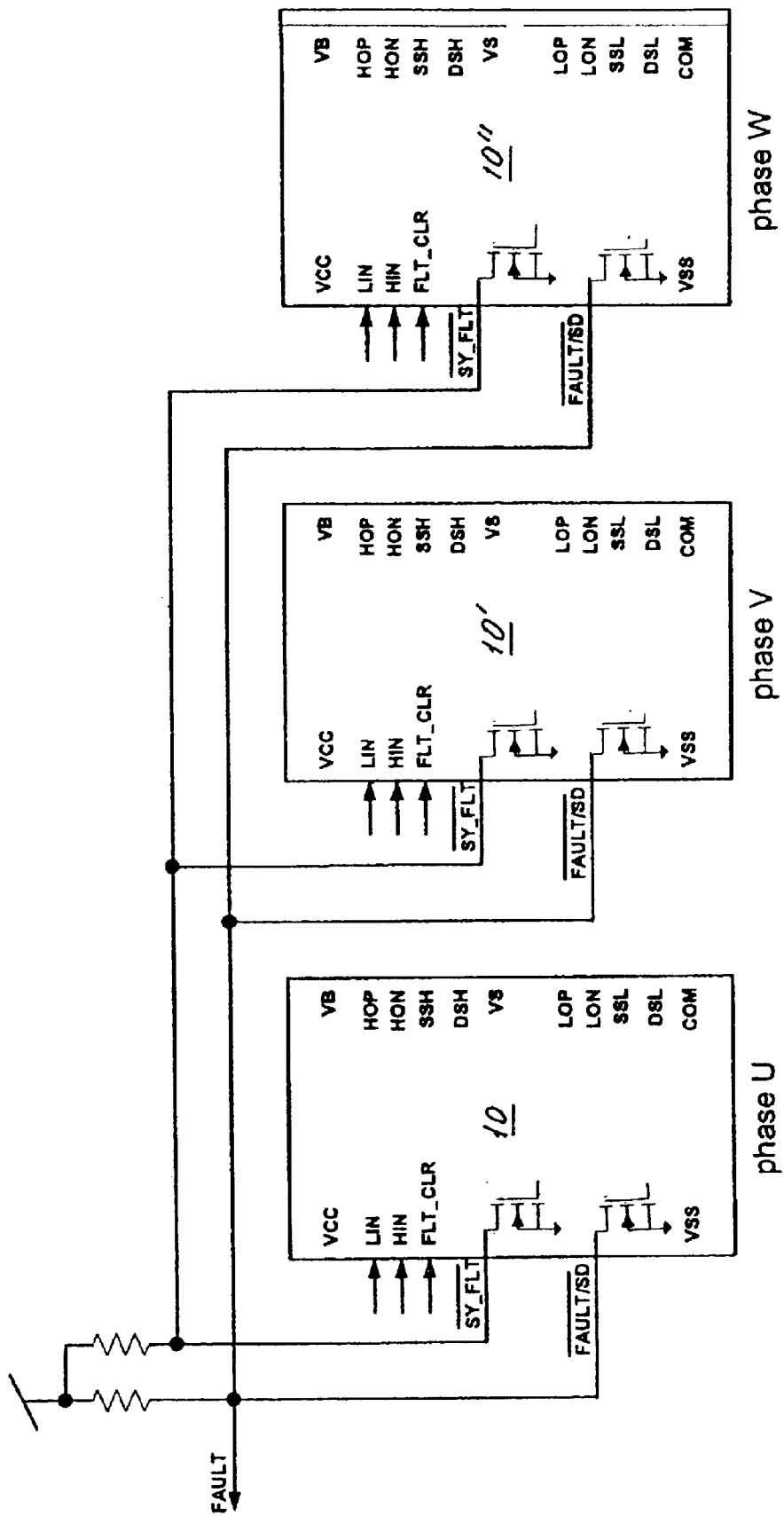
FIG. 19 shows another embodiment of the present invention.

After asserting a fault clear input FLTCLR, the external controller may reinitiate normal operational control of the gate driver integrated circuits 10, 10', 10" using the input controls HIN, LIN. For example, during normal operation the external controller asserts switching control inputs HIN, LIN such that the high side power transistors are switched on and off by the gate driver integrated circuits 10, 10', 10" in a multiphase system, as shown in FIG. 19.

In one embodiment, under-voltage fault protection and external hard shutdown are masked during a soft shutdown sequence, as shown in the fault control circuit of FIG. 4. Thus, desaturation protection is an independent and overriding process that is disabled only when the output status is off or during transients defined by the filters in the output stages 50, as described previously.

As shown in FIG. 5, the predriver 51 may comprise two turn-on switches 53, 54 and one turn-off switch 55. A first turn-on switch 54 is constantly asserted while the second turn-on switch 53 is maintained active only for a limited time $t_{ON1}$. In this embodiment, the second switch boosts the total driving capability, accommodating both fast gate charging to the plateau voltage and transient voltage control during switching. A single turn-off switch 55 offers a low impedance path, which prevents self turn-on due to parasitic Miller capacitance in the power switch, for example.

Figure 1:
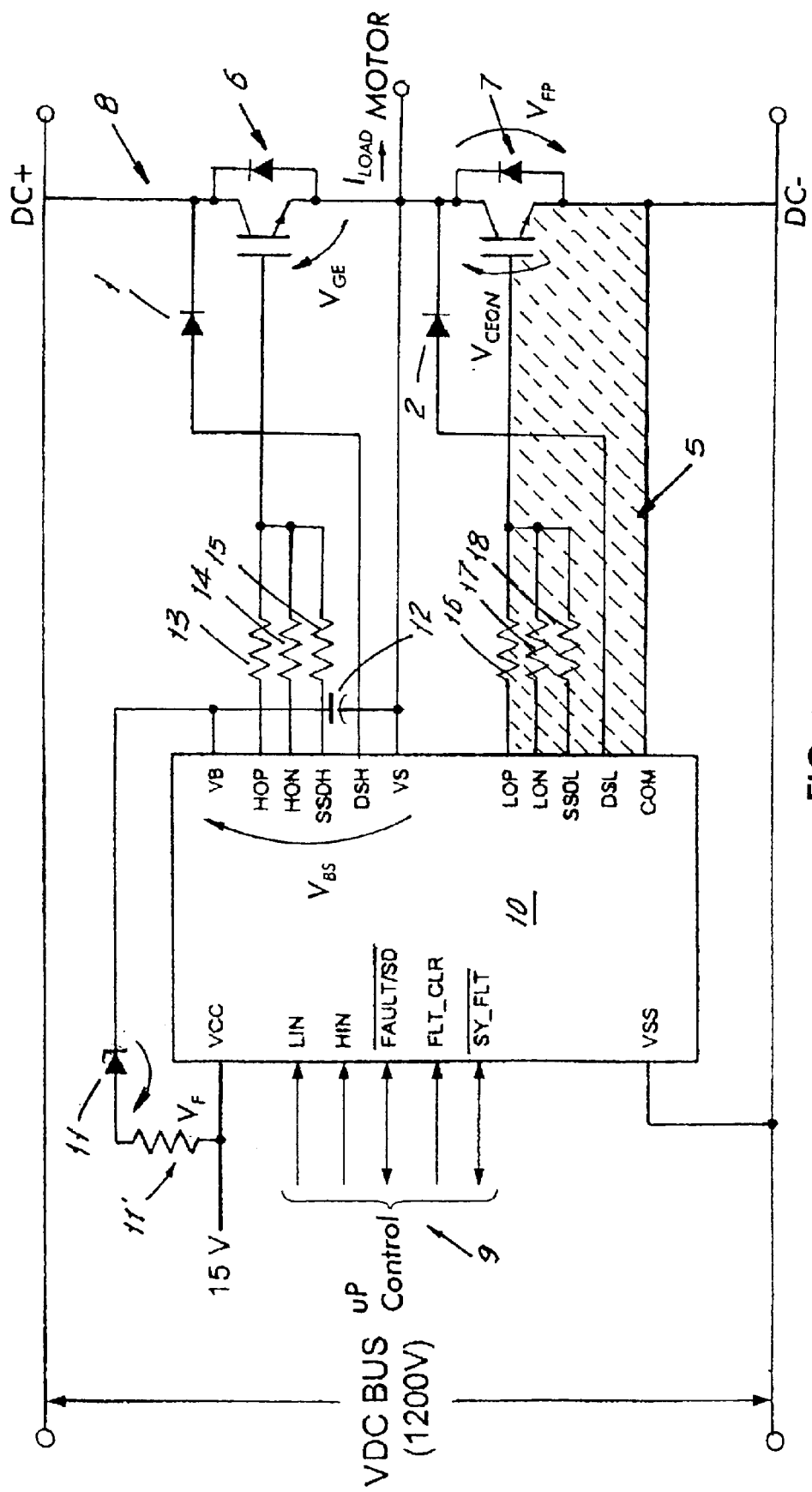
FIG. 1 shows one embodiment of the present invention electrically connected in a half-bridge circuit.
Figure 10:
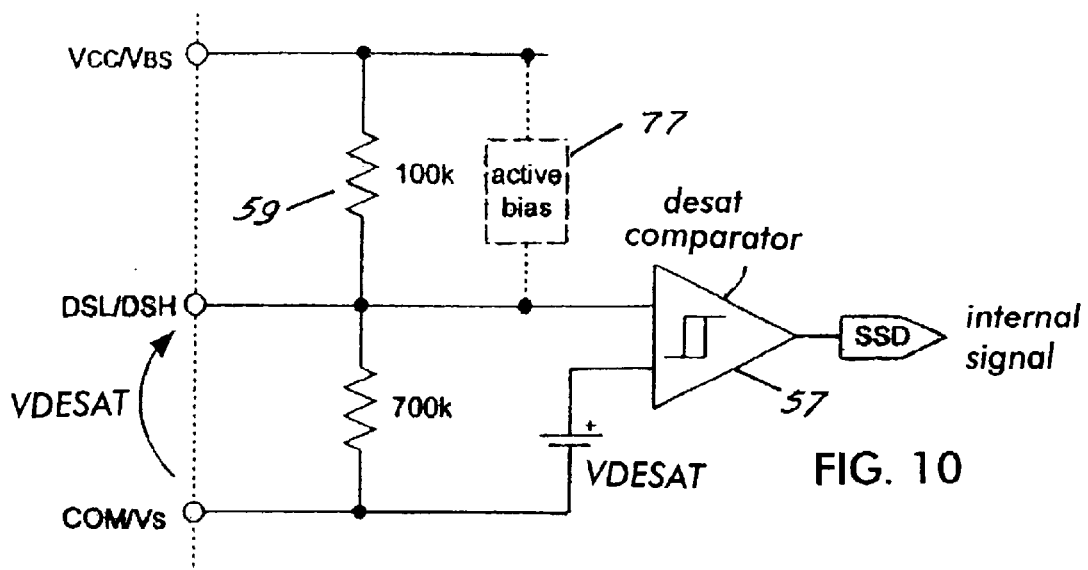
FIG. 10 shows the generation of an internal signal based on feedback signals, including the desaturation voltage.

In an alternative embodiment, a dedicated circuit provides an active bias as shown in FIG. 10. Active biasing is used in the sensing and desaturation circuit of the output stage 50, as shown in FIG. 10. In a high side circuit, the desaturation biasing current may become relevant for dimensioning a bootstrap capacitor 12, which is shown in FIG. 1. If the value of the pull up resistor $R_{DSH}$, $R_{DSL}$ in a non-actively biased circuit is too low, the bootstrap capacitor 12 may be discharged significantly by a high current across the pull up resistor $R_{DSH}$, $R_{DSL}$. Thus, the resistance of the pull up resistor $R_{DSH}$, $R_{DSL}$ is selected to be at least about 100 kiloOhms (k$\Omega$). The change in voltage with time applied by the power transistor 6, 7 during commutation may inject considerable current, because the impedance is only controlled by the pull up resistor $R_{DSH}$ when the transistor is off, resulting in considerable current injected through stray capacitance of the diode 1 into the desaturation detection pin DSH. Active biasing reduces this noise. For example, a dedicated biasing current is selected that reduces the impedance on the desaturation detection pin DSH, when the voltage exceeds the desaturation threshold voltage $V_{DESAT}$. In one embodiment, the impedance is reduced from about 100 k$\Omega$ to only about 100 Ohms ($\Omega$), which helps to reject the noise caused by current injection by the parasitic capacitance. When the power transistor is fully on, the sensing diode gets forward bias and the voltage at the desaturation pin DSH decreases. At this point, the active biasing circuit deactivates, reducing the bias current through the sensing diode 1.

Figure 3:
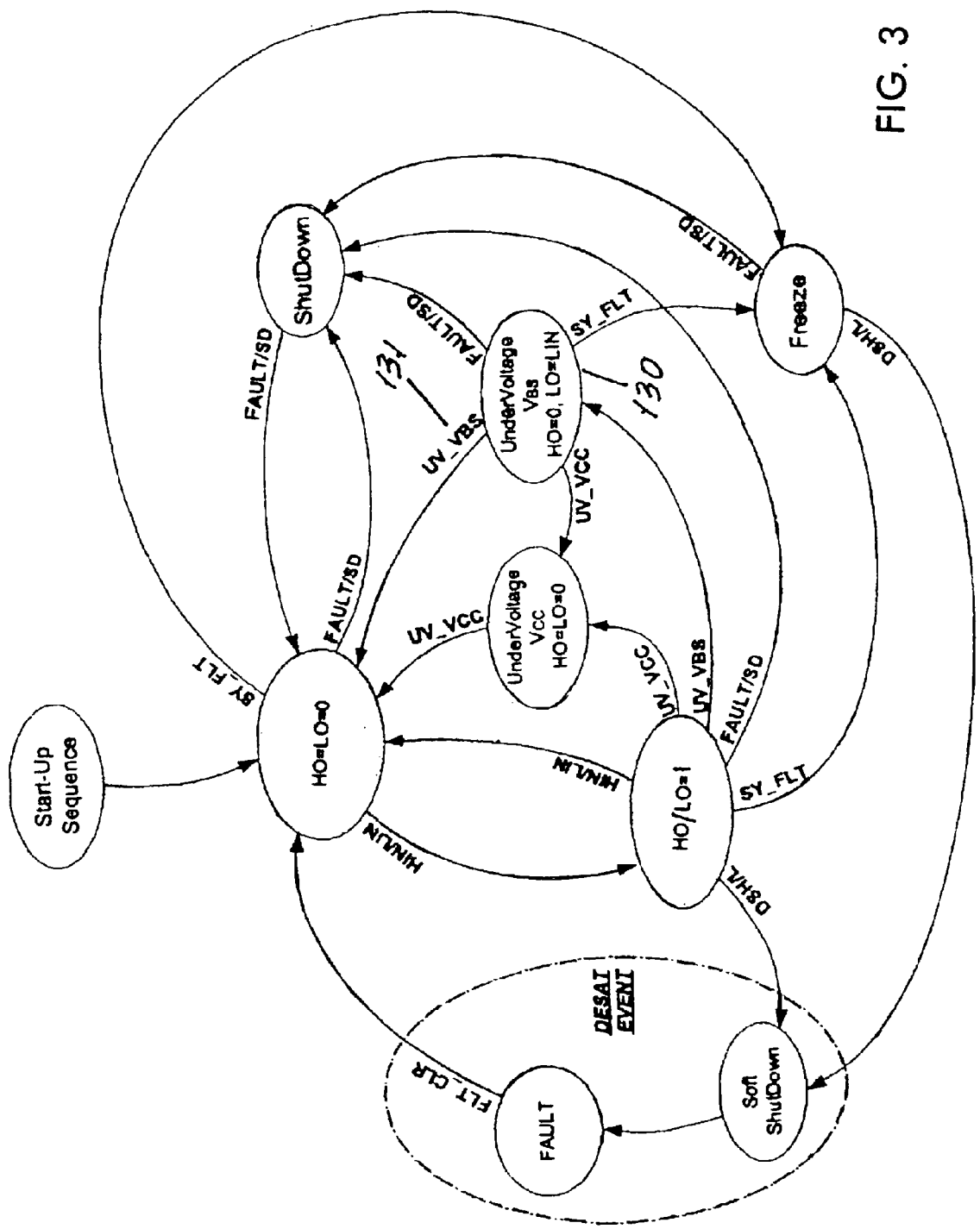
FIG. 3 illustrates a state diagram of the embodiment shown in FIG. 2.

In another embodiment, more than one gate driver integrated circuit is used in a multi-phase system, as shown in FIG. 19, for a three phase example. A bidirectional desaturation fault input/output SY_FLT is connected by a local dedicated network, such as a bus, to each gate driver integrated circuit 10. Then, if desaturation is detected and a desaturation fault output SY_FLT is asserted by one of the integrated circuits 10, then the desaturation fault state of one gate driver integrated circuit 10 is read by each of the other gate drivers integrated circuits. Thus, the other output stages 50 enter a hold state, regardless of the input signals HIN, LIN received from the external controller. In case of a phase to phase short circuit where two insulating gate bipolar transistors are involved, this prevents a hard shutdown while one gate driver is in a soft shutdown state, which prevents a vanishing soft shutdown. However, the output stages 50 that are in a hold state are not completely inactive, because desaturation detection takes the highest priority overriding a hold state (freeze), as shown in FIGS. 3 and 4. Thus, the local network for the desaturation fault output SY_FLT may be a local network solely between the drivers need not be connected to the external controller.

In one embodiment, another bidirectional fault indicator FAULT/SD may be connected in a network with each of the other gate drivers and the system controller. When asserted, the shutdown fault output FAULT/SD commands a hard shutdown of all of the output stages 50 of each of the gate driver integrated circuits 10, 10', 10". For example, there are three events that can force a hard shutdown:

1. Desaturation Detection Event. The FAULT/SD connection is latched low when the soft shutdown sequence is completed, and only a fault clear input FLT_CLR from the external controller is capable of resetting the gate controllers. According to this example, the external controller must be connected to the FAULT/SD network and to the FLT_CLR connection of each gate driver 10.

2. Under-voltage on the Fixed Supply Voltage $V_{CC}$. The FAULT/SD connection is forced low and held low until the supply voltage returns above the under-voltage threshold (not latched). When a plurality of gate drivers 10 are connected to a FAULT/SD network, then the FAULT/SD connection may generate an external fault to other gate drivers 10.

3. External Fault. The FAULT/SD pin is externally driven low either by the controller or by another gate driver integrated circuit (not latched). When the controller or the other gate driver 10', 10" deactivates the FAULT/SD pin, then the gate driver 10 may return to normal operating mode.

In one example, as shown in FIG. 1, a gate driver integrated circuit 10 is electrically connected to a 1200 volt DC bus $V_B$ and a 15 volt power supply is bootstrapped using a bootstrap diode 11 connected to the logic supply voltage $V_{CC}$ connector and the high side supply voltage $V_B$ connection and a bootstrap capacitor 12 which is connected between $V_B$ and the high side offset voltage $V_S$ connection. Three gate resistors 13, 14, 15 are attached to the high side pins HOP, HON and SSDH pins, respectively. Three more gate resistors 16, 17, 18 are attached to low side pins LOP, LON and SSDL, respectively.

For example, three gate resistors 16, 17, 18 are placed close together and the gate loop area 5 defined by the area between the gate resistances, the drain of a MOSFET and the voltage connected to the drain of the MOSFET is reduced, reducing electromagnetic noise. Otherwise, unnecessary electromagnetic noise may be generated by the gate drive loop 5 acting as an antenna, receiving and transmitting electromagnetic waves. Also, current may be injected inside the gate drive loop 5 via collector-to-gate parasitic capacitances of an insulating gate bipolar transistor (IGBT).

Parasitic auto-inductance of the gate loop 5 may contribute to development of a voltage across the gate emitter, which increases the possibility of self turn-on. Therefore, the grouping of the high side gate driver and the low side gate driver pins, such as shown in FIG. 1, allows the gate drive loop areas 5 to be reduced, reducing the chances for undesirable self turn-on of the transistor 6, 7.

FIG. 2 illustrates a block diagram of a gate driver integrated circuit 10. The control pins 9 include high side input logic pin (HIN), low side logic input pin (LIN), a dual function input/output active low pin (FAULT/SD), another dual function input/output active low pin (SY_FLT) and a fault clear active high input (FLT_CLR). Separate logic control input pins HIN, LIN allow the high side and low side gate drivers to be controlled independently of each other by an external controller (not shown).

The FAULT/SD pin has a dual function, indicating a fault state as an output and shutting down the output of the gate drivers regardless of HIN or LIN status as an input, for example. The SY_FLT pin also has a dual function, indicating occurrence of a soft shutdown sequence as an output and activating a hold on the output status of both the high side and low side (freeze state) as an active low input signal, for example.

Figure 17:
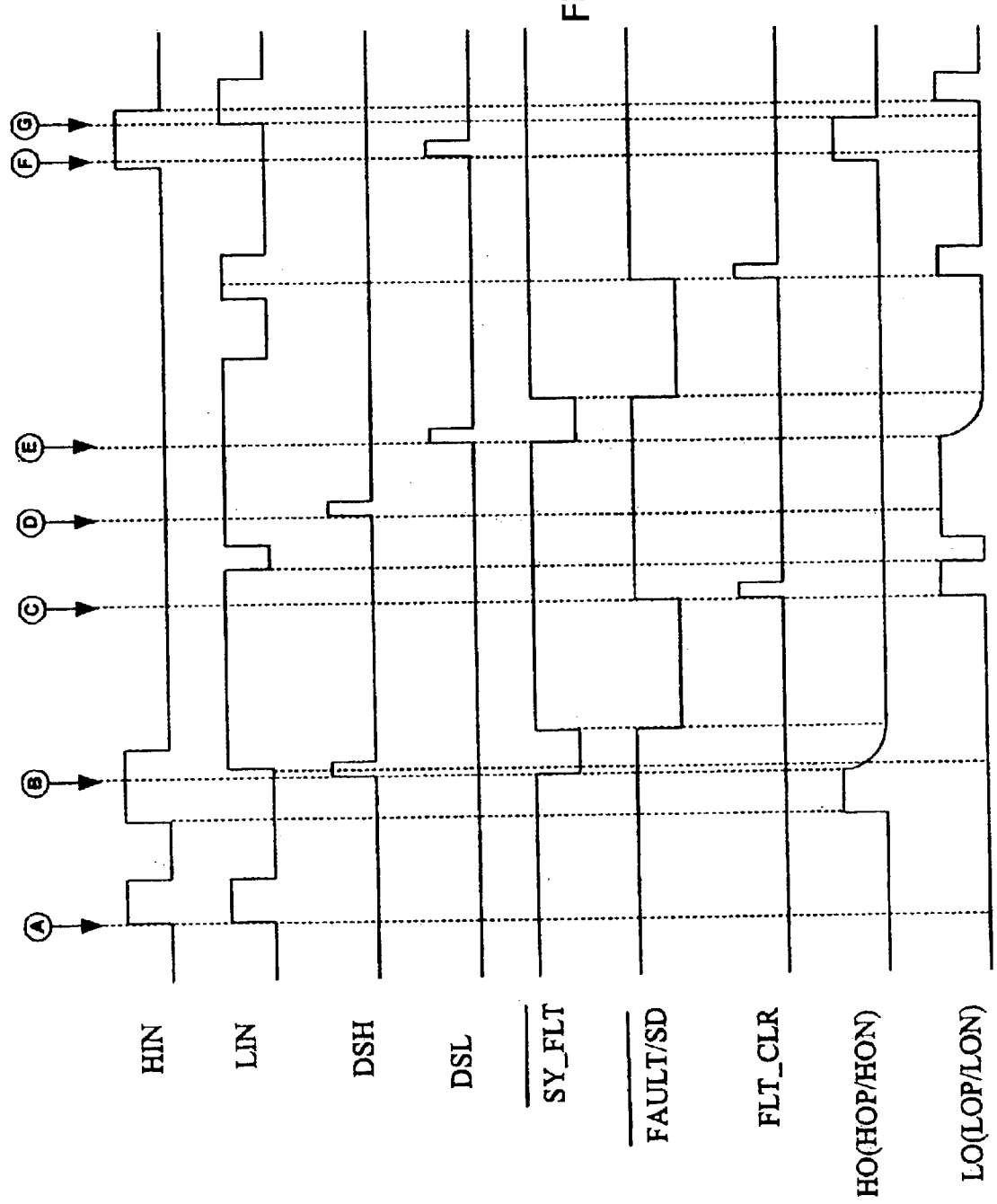
FIG. 17 illustrates the input/output timing diagram with SY_FLT and FAULT/SD as output.
Figure 18:
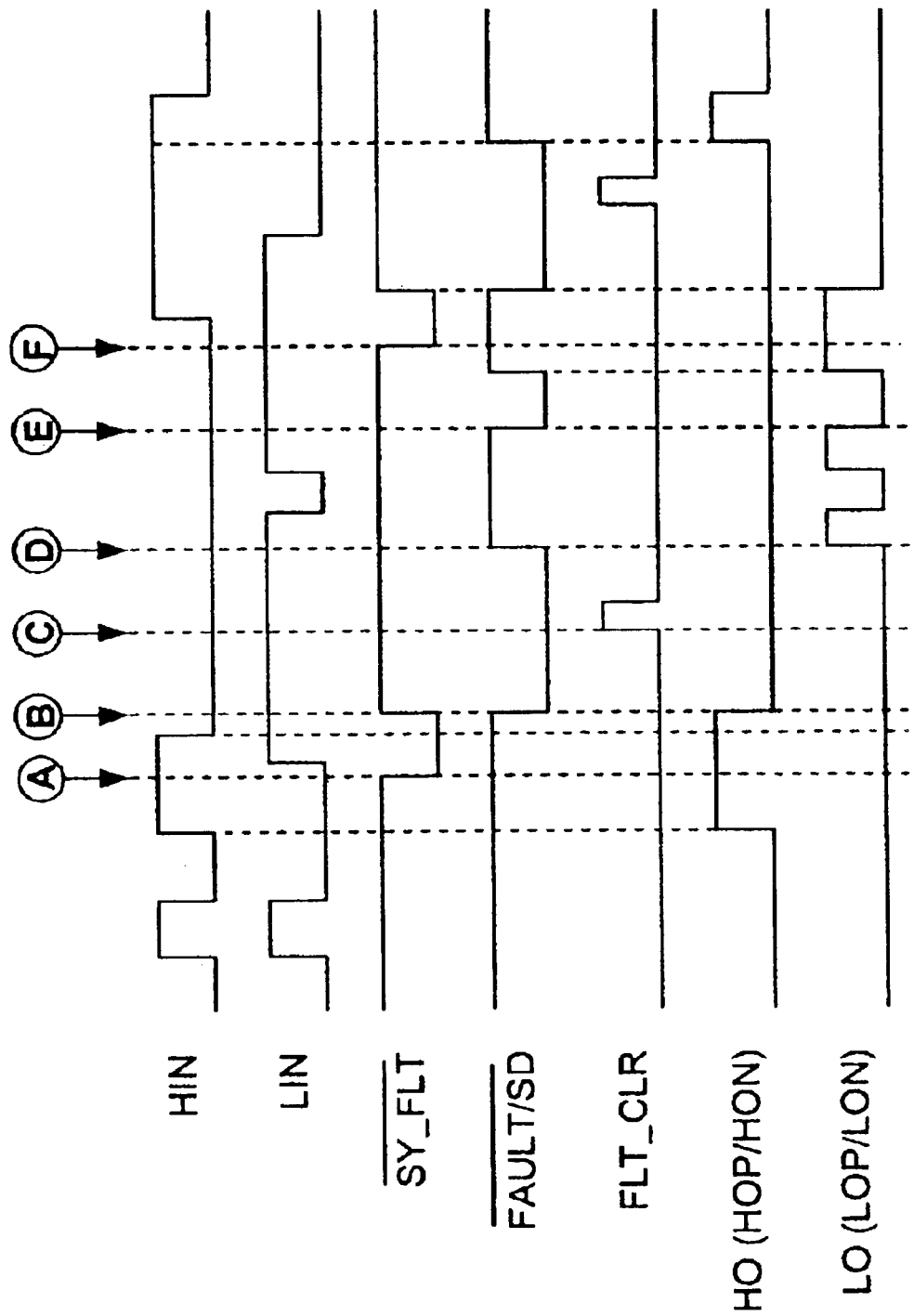
FIG. 18 shows the input/output logic diagram with SY_FLT and FAULT/SD as input.

For example, the logic of the fault control circuit 40 is shown in FIG. 4, and the timing and logic diagrams of FIGS. 17 and 18 show the resulting effect on the integrated circuit 10. Referring to FIG. 17, an input/output timing diagram is shown with SY_FLT and FAULT/SD as output signals. When the input signals HIN and LIN are both on, the output signals are turned off, providing anti-shoot through protection, as shown at position A. At position B, the high output signal is on and the high side IGBT desaturates, e.g. DSH goes active high, causing SY_FLT output to register active low. The high output shuts down softly while the SY_FLT output signal stays low. Then, when the SY_FLT goes high, the fault control circuit 40 asserts the shutdown fault FAULT/SD low. While in soft shut-down, the low output is placed in a hold state (freeze) by the fault control circuit 40, even if the external controller asserts or deactivates input control LIN. After soft shutdown, the fault control circuit 40 latches a hard shutdown FAULT/SD. While FAULT/SD is latched low, the FLT_CLR pin may be asserted to disable the FAULT/SD, resetting the fault control circuit 40 and allowing the output to return to following the inputs, as shown after position C in the timing diagram of FIG. 17. At position D, the high side DS pin input voltage (DSH) becomes high, but the high DSH is not read since the high side output voltage HOP, HON is off.

At position E, the low side output voltages LOP, LON are on, when the low side desaturation input voltage DSL becomes active high. Thus, low side IGBT desaturation is detected, and the low side output voltages LOP, LON shut down softly (gradual shut down via SSDL), while the SY_FLT output signal is asserted low by the fault control circuit 40. When SY_FLT is released, then the fault control circuit 40 asserts the shutdown fault FAULT/SD low. During the soft shutdown sequence, changes in the external control inputs HIN, LIN are ignored. After completing the soft shutdown sequence, the fault control circuit 40 asserts a hard shutdown FAULT/SD, which is later cleared FLT_CLR by the external controller.

FIG. 18 shows the logic diagram with SY_FLT and FAULT/SD as inputs. At position A, the device 10 is in a hold state, regardless of input variations. The hold state is forced by externally forcing SY_FLT low. Thus, during the hold state, changes in the low and high side logic input voltages HIN, LIN are frozen by the fault control circuit 40, having no effect on the output stages 50. At position B, the device 10 has all output voltages turned off by the fault control circuit 40 in response to the assertion of an externally-driven, active-low shutdown fault signal FAULT/SD. At position C, assertion of FLT_CLR has no effect, because FLT_CLR to the local gate driver integrated circuit 10 does not disable an active, external hard shutdown state. At position D, the external FAULT/SD signal is released, and the output voltages HOP, HON, LOP, LON return to following the control input voltages HIN, LIN. Since the external hard shut-down state is not latched by the fault control circuit 40 of the local gate driver integrated circuit 10. Reasserting FAULT/SD by externally driving the FAULT/SD pin low causes another hard shut-down at point E. Externally forcing SY_FLT low at point F, once again puts the integrate circuit 10 into a hold state, freezing the status of the high and low output voltages, until the external SY—FLT is released, and an external FAULT/SD is asserted, shutting down the output stages 50.

FIG. 3 shows a logic map of the various states of one embodiment of the present invention. On the high side output stage, an under-voltage state is determined for high side voltage difference $V_{BS}$, which is the difference between floating supply voltage $V_B$ and high side offset voltage $V_S$. On the low side output stage, an under-voltage state is detected for the low side supply voltage $V_{CC}$. System variables, such as FLT_CLR, HIN, LIN, low side under-voltage, UV_$V_{CC}$, high side under-voltage UV_$V_{BS}$, DSH, DSL, SY_FLT and FAULT/SD, are shown as signals labeled on the lines of FIG. 3. The logic states are shown within the ovals. A change of logic value of the signal shown on the lines in FIG. 3 generates a state transition. For example, when the device is presently in an under-voltage $V_{BS}$ state 130, the signal UV—$V_{BS}$ 131 is asserted and the high output is shut down by the output side gate driver circuit 50 of FIG. 2. For example, the only way for the high side output voltages HON, HOP to turn on is if a rising edge event is asserted in the high side input voltage logic HIN.

Regarding FIG. 4, DesatHS and DesatLS are internal signals originating from the high side and low side gate drivers 50. The Desat logical OR gate 91 is on if either DesatHS or DesatLS is asserted. The logical state of the OR gate 91 is input to a logic switch circuit 92, an intermediate OR gate 93 and the gate of transistor 96, which takes SY_FLT low by switching to $V_{SS}$. Thus, an internal hold signal is asserted and passed from the logic management circuit 40 to the hold stage 42 of the input stage 71, as shown in FIG. 2. For example, during soft shutdown control logic inputs, under-voltage fault and external hard shutdown are masked until the end of soft shut-down by the logic elements 92, 93, 94, 95 and 98 of the fault control circuit 40 and the internal hold stage 42. Thus, desaturation protection works independently of the external controller and under-voltage protection measures.

FIG. 5 illustrates one embodiment of a gate driver output stage that may be used for either the high side or the low side output stages 50. The pre-driver 51 controls operation of the output switching transistors 53, 54, 55. The remainder of the circuit provides local desaturation protection and soft shutdown circuitry via external desaturation detection connection DesatHS/LS. The external sensing diode 1, 2 is biased by an internal pull-up resistor 59 or, alternatively, by an active dias circuit (e.g. FIG. 10) for actively biasing the sensing diode as discussed in a previous embodiment. The IGBT collector to emitter voltage ($V_{CE}$) of the power transistor 110 is monitored by the sensing diode 1, 2, allowing the gate driver output stage 50 to smoothly turn off a desaturated transistor 110 using the SSD H/L pin for a soft shutdown. Thus, a desaturated transistor 110 is protected from transient over-voltage.

In the embodiment shown in FIG. 5, when $V_{CE}$ increases, the sensed voltage $V_{DSH}$, $V_{DSL}$ at the desaturatation pin DSH, DSL increases also. Being internally biased to the local supply, the sensed voltage $V_{DSH}$, $V_{DSL}$ at the desaturation pin DSH, DSL is automatically clamped. If the sensed voltage $V_{DSH}$, $V_{DSL}$ exceeds the desaturation voltage threshold $V_{DESAT}$ of the desaturation comparator 57, then the desaturation comparator 57 is triggered. In one embodiment, a noise filter 61 is used to avoid false desaturation detection by externally induced noise, filtering pulses shorter than the pulse width of the desaturation trigger 58.

In one embodiment, during IGBT turn-on, the desaturation circuit is disabled by a blanking signal from a blanking circuit 62 that is connected to the on/off signal for avoiding false desaturation during IGBT turn-on. The blanking circuit 62 disables the trigger 58 for a blanking period $t_{BL}$, which may be a predetermined maximum IGBT turn-on time, for example. Gate resistances should be sized to avoid incomplete saturation after the predetermined blocking time $t_{BL}$. Otherwise, desaturation detection may shutdown the output stage 50 inadvertently during IGBT turn-on.

While in a soft shut-down sequence, the output stage 40 goes into high impedance, and the pull down switch 56 is asserted to turn off the IGBT via the soft shut-down pin SSDH, SSDL. The fault control circuit asserts a desaturation fault at SY_FLT output pin (e.g. active low), externally reporting the soft shutdown status on the dedicated local network during the entire soft shutdown sequence, which continues for a shutdown period $t_{SS}$, for example. Then, the fault control circuit 40 releases the desaturation fault output SY_FLT and generates a shutdown fault signal FAULT/SD internally and externally. By activating the internal shutdown fault signal FAULT/SD, a hard shut-down is latched for the high and low output stages 50 by the shutdown stage 73. For example, the gate driver integrated circuit 10 is latched low until the fault is cleared, by the external controller asserting a fault clear signal FLT_CLR, which prompts the fault control circuit 40 to reset the integrated circuit 10 using logic switch circuit 92.

The high side floating supply voltage $V_B$ provides the voltage supply to the high side driver circuitry. This supply sits on top of the offset voltage $V_S$. Thus, the high side floating supply voltage $V_B$ and the offset voltage $V_S$ provide the high side supply voltage $V_{BS}$.

Using a bootstrap supply voltage has the advantage of being simple and low cost; however, the method is limited by the requirement to refresh the charge in the bootstrap capacitor 12. Proper bootstrap capacitor 12 selection helps to reduce limitations on the duty-cycle and on-time of the output stages, which is limited by a need to refresh the bootstrap capacitor 12.

To size the bootstrap capacitor 12, the first step is to establish the minimum voltage drop ($\Delta V_{BS}$) that is needed when the high side IGBT is on. If $V_{GEmin}$ is the minimum gate emitter voltage we want to maintain, the voltage drop if found by:

$$\Delta V_{BS} \leq V_{CC} - V_F - V_{GEmin} - V_{CEon}$$

under the condition:

$$V_{GEmin} > V_{BSUV-}$$

where $V_{CC}$ is the IC voltage supply, $V_F$ is bootstrap diode forward voltage, $V_{CEon}$ is emitter-collector voltage of low side IGBT and $V_{BSUV-}$ is the high-side supply under-voltage negative going threshold.

Now, consider the factors that influence a decrease in $V_{BS}$:

IGBT turn on required Gate charge ($Q_G$);

IGBT gate-source leakage current ($I_{LK\_GE}$);

Floating section leakage current ($I_{lk}$)

Bootstrap diode leakage current ($I_{LK\_DIODE}$);

Desat diode bias when on ($I_{DS-}$)

Charge required by the internal level shifters ($Q_{LS}$); typical 20 nC

Bootstrap capacitor leakage current ($I_{LK\_CAP}$);

High side on time ($T_{HON}$).

$I_{LK\_CAP}$ is relevant only when using an electrolytic capacitor and can be ignored if other types of capacitors are used. Preferably, at least one low ESR ceramic capacitor is used. For example, paralleling electrolytic and low ESR ceramic may result in an efficient solution.

Then, the following equation is derived:

$$Q_{TOT} = Q_G + Q_{LS} + (I_{LK\_GE} + I_{QBS} + I_{LK} + I_{LK\_DIODE} + I_{LK\_CAP} + I_{DS-}) \cdot T_{HON}$$

The minimum size of bootstrap capacitor is:

$$C_{BOOTmin} = \frac{Q_{TOT}}{\Delta V_{BS}}$$

As one example, the following parameters are used:

a) using a 25 A @ 125C IGBT (e.g. IRGP30B120KD);

$I_{QBS}$=800 μA (See Static Electrical Charact.);

$I_{lk}$=50 μA (See Static Electrical Charact.);

$Q_{LS}$=20 nC;

$Q_B$=160 nC (Datasheet IRGP30B120KD);

$I_{LK\_GE}$=100 nA (Datasheet IRG30B120KD);

$I_{LK\_DIODE}$=100 μA (with reverse recovery time<100 ns)

$I_{LK\_CAP}$=0 (neglected for ceramic capacitor);

$I_{DS-}$=150 μA (SEE Static Electrical Charact.);

$T_{HON}$=100 μs.

And:

$V_{CC}$=15 V $V_F$=1 V $V_{CEonmax}$=3.1 V $V_{GEmin}$=10.5 V

The maximum voltage drop $\Delta V_{BS}$ becomes $$\Delta V_{BS} \leq V_{CC} - V_F - V_{GEmin} - V_{CEon} =$$
$$= 15\ V - 1\ V - 10.5\ V - 3.1\ V = 0.4\ V$$

and the bootstrap capacitor is:

$$C_{BOOT} \geq \frac{290\ nC}{0.4\ V} = 725\ nF$$

In this example, $V_{CC}$ has been chosen to be 15V. Some IGBTs may require a logic supply voltage $V_{CC}$ greater than 15V to work correctly with the bootstrap technique. Also, variations in $V_{CC}$ should be considered in the above formulas, which are provided merely as an example.

The worst case for a bootstrap capacitor is when the load current $I_{LOAD}$ is negative. Thus, the bootstrap should be sized to accommodate such a situation.

In one embodiment, a bootstrap resistor ($R_{boot}$) is placed in series with bootstrap diodes (see FIG. 19) to limit the current when the bootstrap capacitor is initially charged. Preferably, the $R_{boot}$ does not exceed a resistance of between 5–10 Ohms, to avoid increasing the $V_{BS}$ time-constant $t_{HON}$. The minimum on time for charging the bootstrap capacitor 12 or for refreshing its charge must be verified against this time-constant $t_{HON}$.

For high $t_{HON}$ designs that use an electrolytic tank capacitor, ESR must be considered. This parasitic resistance forms a voltage divider with $R_{boot}$ generating a voltage step on $V_{BS}$ upon charging the bootstrap capacitor 12. The voltage step and the related speed ($dV_{BS}/dT$) should be limited. Preferably, ESR should be designed as follows:

$$\frac{ESR}{ESR + R_{BOOT}} \cdot V_{CC} \leq 3\ V$$

In one embodiment, a combination of small ceramic and large electrolytic capacitors in parallel was found to acceptable, the first acting as fast charge for the gate charge only and limiting the $dV_{BS}/dt$ by reducing the equivalent resistance while the second kept the $V_{BS}$ voltage drop within a desired range $\Delta V_{BS}$.

In one embodiment, a bootstrap diode had a BV>1200 v and a fast recovery time (tm<100 ns) to reduce the amount of charge feed back from the bootstrap capacitor 12 to the fixed supply voltage $V_{CC}$.

The switching speed of the transistor 6, 7 can be controlled by properly sizing the resistors 13–18 controlling the turn-on and turn-off gate current. The following section provides an example for sizing the resistors to obtain a desired switching time and speed by introducing the equivalent output resistance of the gate driver ($R_{DRp}$ and $R_{DRn}$).

Figure 20:
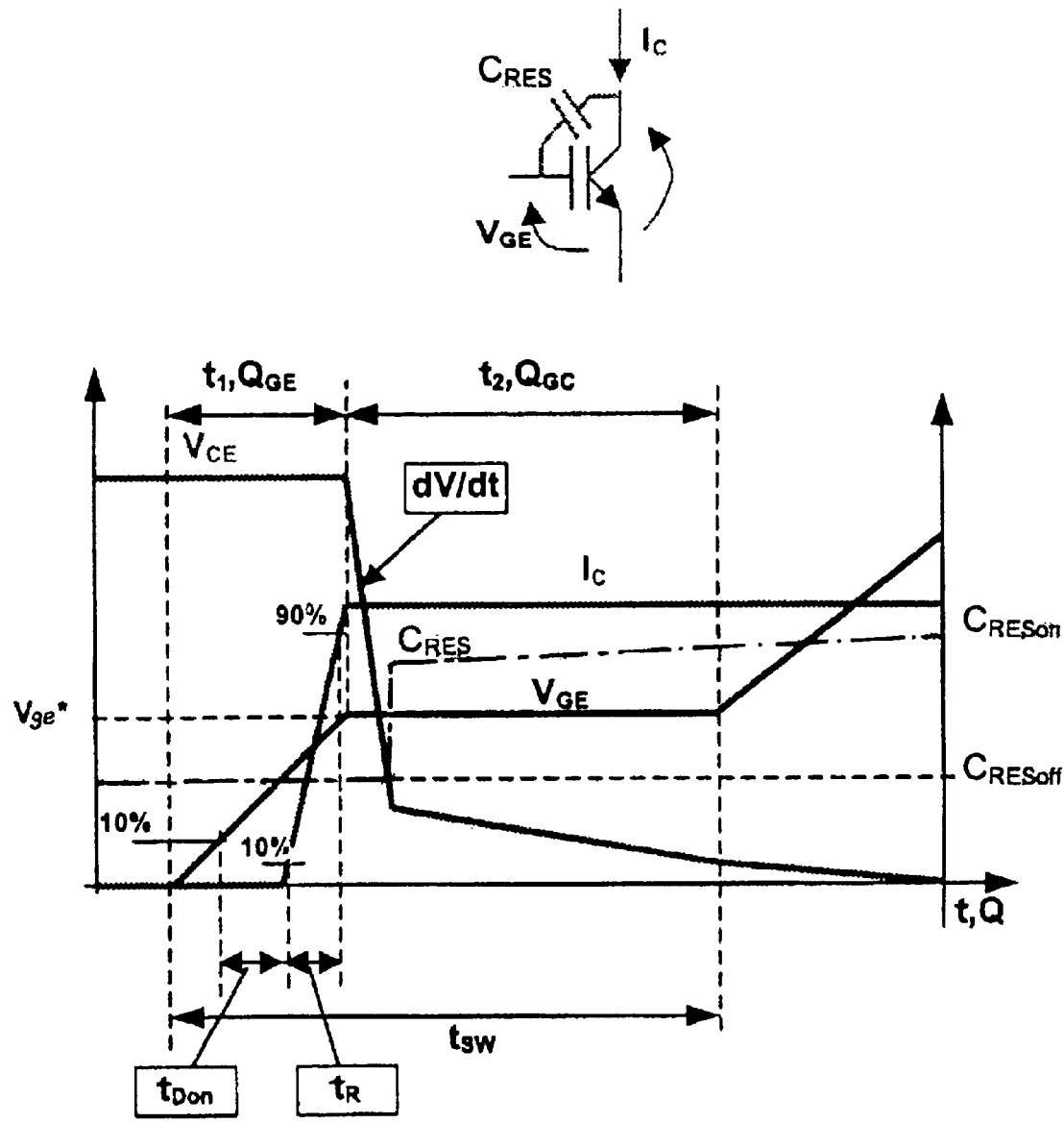
FIG. 20 shows a graphical representation defining nomenclature.

The examples use an IGBT power transistor. FIG. 20 shows the nomenclature used in the following paragraphs. In addition, $V_{ge}^*$ indicates the plateau voltage, $Q_{GC}$ and $Q_{GE}$ indicate the gate to collector and gate to emitter charge, respectively.

Figure 21:
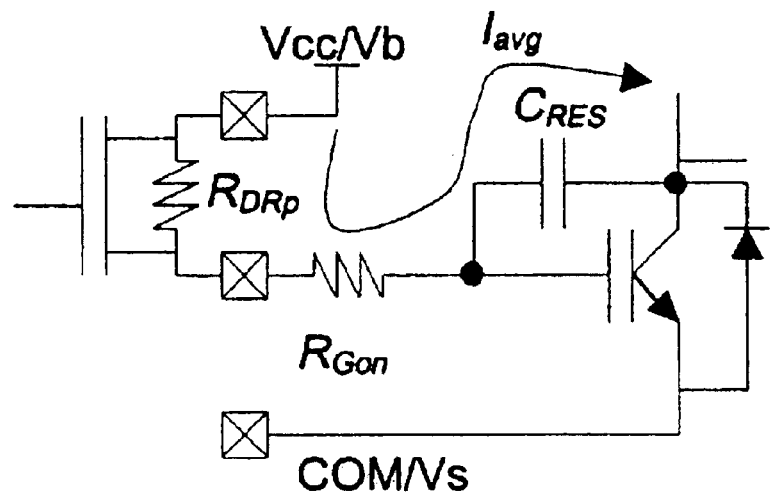
FIG. 21 shows an equivalent circuit diagram for determining the sizing of the gate on resistance $R_{Gon}$ for analysis of the switching time $t_{SW}$.

The switching time $t_{SW}$ is defined as the time spent to reach the end of the plateau voltage (a total $Q_{GC}+Q_{GE}$ has been provided to the IGBT gate). To obtain the desired switching time the gate resistance can be sized starting from $Q_{GE}$ and $Q_{GC}$, $V_{CC}$, $V_{GE}$ (see FIG. 21):

$$I_{avg} = \frac{Q_{GC} + Q_{GE}}{t_{SW}} \qquad (I)$$

and $$R_{TOT} = \frac{V_{CC} - V_{ge}^*}{I_{avg}}$$

where $R_{TOT}=R_{DRp}+R_{Gon}$ $R_{Gon}$=gate on-resistor $R_{DRp}$=driver equivalent on-resistance.

When $R_{Gon}>7$ Ohm, $R_{DRp}$ is defined by $$R_{DRp} = \begin{cases} \frac{t_{on1}}{t_{SW}} \cdot \left[ \frac{V_{CC}}{I_{01+}} + \frac{V_{CC}}{I_{02+}} \left( \frac{t_{SW}}{t_{on1}} - 1 \right) \right] & \text{when } t_{SW} > t_{on1} \\ \frac{V_{CC}}{I_{01+}} & \text{when } t_{SW} \leq t_{on1} \end{cases}$$

($I_{01+}$, $I_{02+}$ and $t_{on1}$ from the IR2214 datasheet).

Table III reports the gate resistance size for two commonly used IGBTs (calculation made using example datasheet values and assuming $V_{CC}=15V$).

Turn-on gate resistance $R_{Gon}$ may be sized to control output slope ($dV_{out}/dt$). While the output voltage has a non-linear behavior, the maximum output slope may be approximated by:

$$\frac{dV_{out}}{dt} = \frac{I_{avg}}{C_{RESoff}}.$$

By inserting the expression (1) and rearranging:

$$R_{TOT} = \frac{V_{CC} - V_{ge}^*}{C_{RESoff} \cdot \frac{dV_{out}}{dt}}.$$

As an example, table IV shows the sizing of gate resistance $R_{Gon}$ to get $dV_{out}/dt=5V/ns$ when using two popular IGBTs, example datasheet values and assuming $V_{CC}=1\ 5V$. The turn on time should be less than the blanking time $t_{BL}$ to avoid desaturation detection during turn on.

Figure 22:
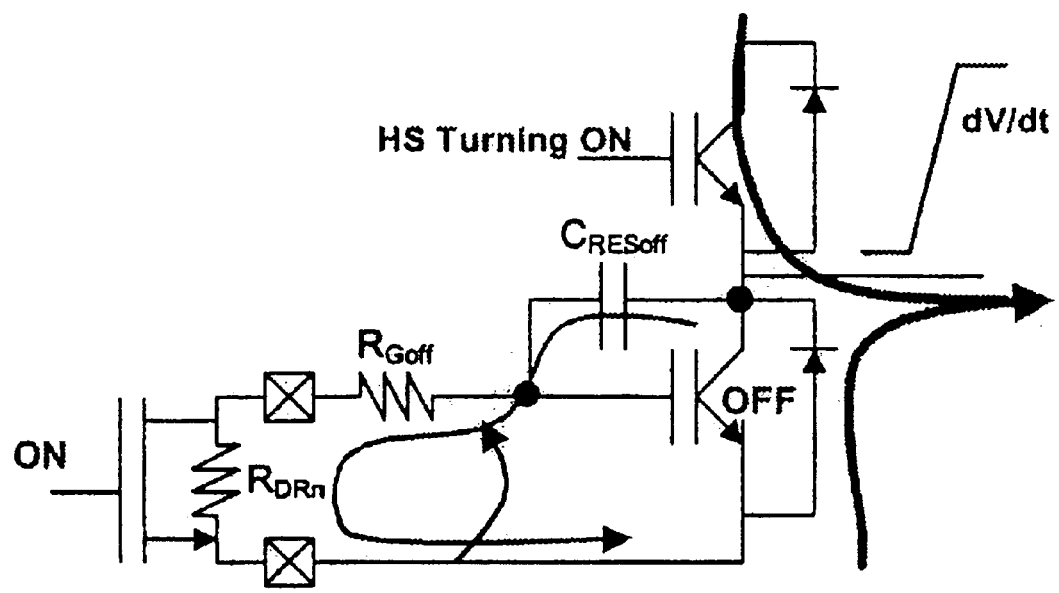
FIG. 22 shows another equivalent circuit diagram for determining the sizing of the turnoff resistance $R_{Goff}$ for use in analysis for IGBT turnoff.
Figure 23:
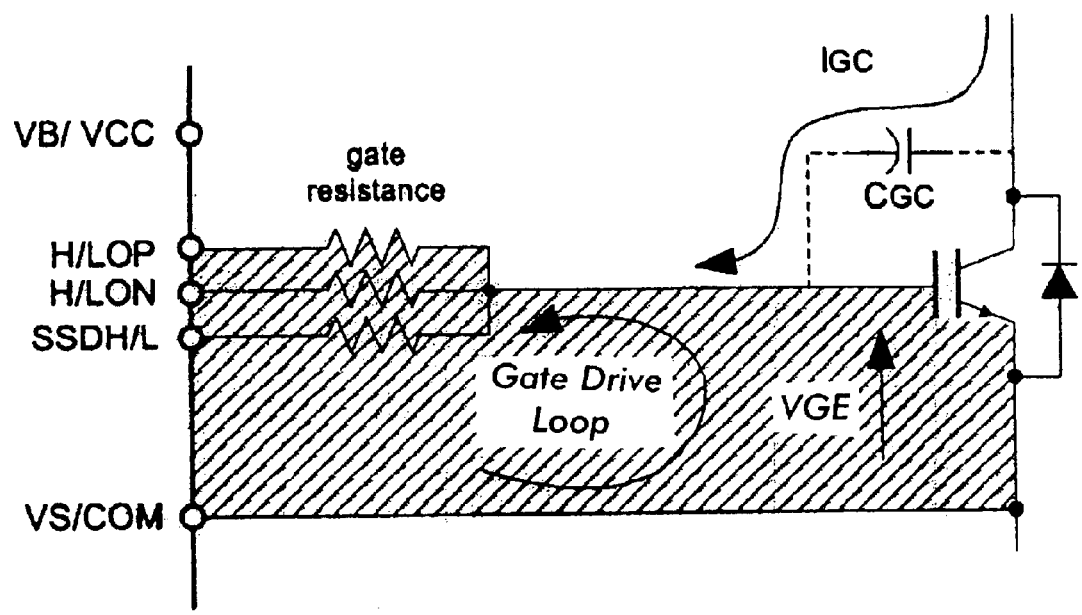
FIG. 23 illustrates a gate drive loop.

The worst case in sizing the turn-off resistor $R_{Goff}$ is when the collector of the IGBT in the off state is forced to commutate by external events (e.g., the turn-on of a companion IGBT). In this case the dV/dt of the output node induces a parasitic current through $C_{RESoff}$ flowing in $R_{Goff}$ and $R_{DRn}$. FIG. 22 shows the current path when the low side is off and the high side turns on. If the voltage drop at the gate exceeds the threshold voltage of the IGBT, the device may self turn on, which is not desirable. Thus, the following analysis should be followed to correctly select the value of the gate turn-off resistance $R_{Goff}$.

The circuit of FIG. 22 corresponds to the following equation:

$$V_{th} \geq (R_{Goff} + R_{DRn}) \cdot I = (R_{Goff} + R_{DRn}) \cdot C_{RESoff} \frac{dV_{out}}{dt}$$

Rearranging the equation yields:

$$R_{Goff} \leq \frac{V_{th}}{C_{RESoff} \cdot \frac{dV}{dt}} - R_{DRn}$$

When $R_{Goff}>4$ ohm, $R_{DRn}$ is well defined by $V_{CC}/I_{O-}$ ($I_{O-}$ from IR2214 datasheet). As an example, Table V reports $R_{Goff}$ for two popular IGBT and $dV_{out}/dt=5V/ns$.

The examples are merely intended to provide a simple way to approximate the gate resistance sizing. A more accurate sizing may provide a more precise device model. Such models may be simulated using known circuit simulation methods.

In one example, a gate driver integrated circuit pin out maximizes the distance between floating (from DC− to DC+) and low voltage pins. Preferably, high side components, such as resistors, diodes and IGBT are placed on the high voltage side of device, while the other components are placed on the low voltage side of the device. Also, the ground plane should not be placed near the high voltage floating side if noise coupling is to be avoided.

Current loops behave like an antenna able to receive and transmit electromagnetic (EM) noise. In order to reduce EM coupling and improve the power switch turn on/off performance, gate drive loops should be reduced. FIG. 1 shows a low side gate loop 5, for example.

Moreover, current may be injected inside the gate drive loop via the IGBT collector-to-gate parasitic capacitance. The parasitic auto-inductance of the gate loop may develop a voltage across the gate-emitter increasing the possibility of self turn-on effect. Preferably, the three gate resistances are placed close together to reduce the area of the gate loop 5.

Gate driver output stages are able to quickly turn on an IGBT with up to 2 A of output current, for example. In one embodiment, the supply capacitors are placed as close as possible to the device pins ($V_{CC}$ and $V_{SS}$ for the ground tied supply, $V_B$ and $V_S$ for the floating supply) to reduce parasitic inductance/resistance.

Figure 24A:
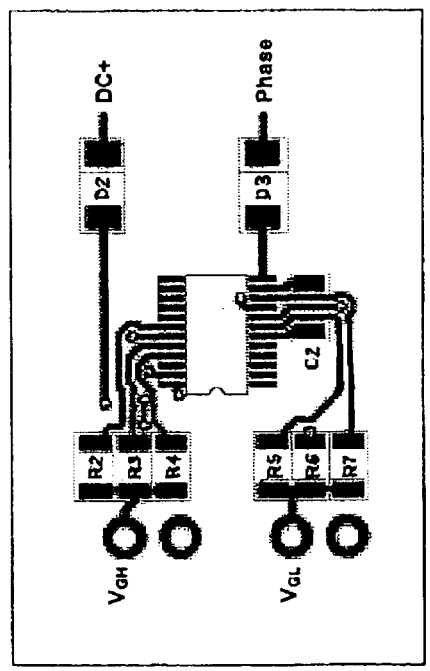
FIGS. 24a through 24c show an example of a three layer printed circuit board layout for one embodiment of the present invention.
Figure 24B:
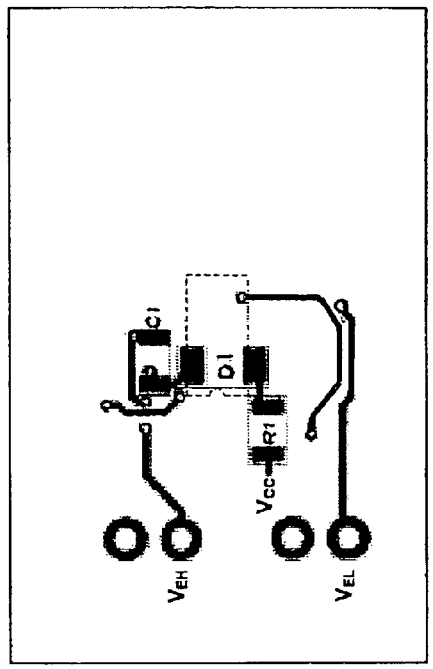
Figure 24C:
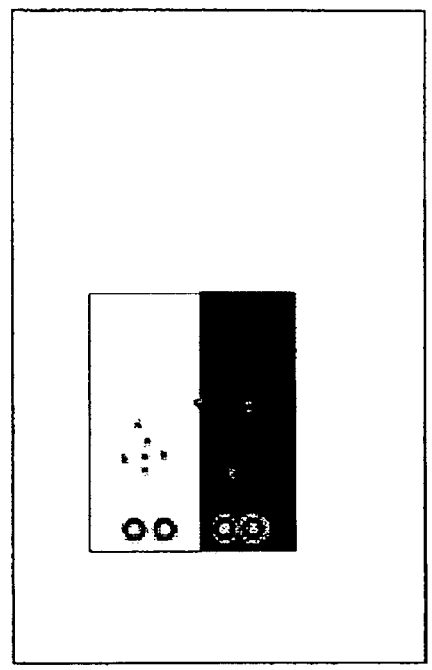

FIG. 24 shows one example of a PCB using a 3 layer PCB. Placement and routing for supply capacitors and gate resistances in the high and low voltage side reduce supply path and gate drive loops, respectively. The bootstrap diode 11 is placed under the device to have the cathode of the diode 11 as close as possible to bootstrap capacitor 12 and the anode of the diode 11 far from high voltage $V_B$ and close to $V_{CC}$.

Although the present invention has been described in relation to particular embodiments thereof, many other variations and modifications and other uses will become apparent to those skilled in the art. It is preferred, therefore, that the present invention be limited not by the examples herein, but only by the claims themselves.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

TABLE I

Rated Values for an Example of a Gate Driver Integrated Circuit

| Symbol | Definition | Min. | Max. | Units |
|---|---|---|---|---|
| $V_S$ | High side offset voltage | $V_B - 25$ | $V_B + 0.3$ | V |
| $V_B$ | High side floating supply voltage | −0.3 | 1225 | |
| $V_{HO}$ | High side floating output voltage (HOP, HON and SSDH) | $V_S - 0.3$ | $V_B + 0.3$ | |
| $V_{CC}$ | Low side and logic fixed supply voltage | −0.3 | 25 | |
| COM | Power ground | $V_{CC} - 25$ | $V_{CC} + 0.3$ | |
| $V_{LO}$ | Low side output voltage (LOP, LON and SSDL) | $V_{COM} - 0.3$ | $V_{CC} + 0.3$ | |
| $V_{IN}$ | Logic input voltage (HIN, LIN and FLT_CLR) | −0.3 | $V_{CC} + 0.3$ | |
| $V_{FLT}$ | FAULT input/output voltage (FAULT/SD and SY_FLT) | −0.3 | $V_{CC} + 0.3$ | |
| $V_{DSH}$ | High side DS input voltage | $V_B - 25$ | $V_B + 0.3$ | |
| $V_{DSL}$ | Low side DS input voltage | $V_{CC} - 25$ | $V_{CC} + 0.3$ | |
| $dV_s/dt$ | Allowable offset voltage slew rate | — | 50 | V/ns |
| $P_D$ | Package power dissipation @ $T_A \leq +25°$ C. | — | 1.5 | W |
| $Rth_{JA}$ | Thermal resistance, junction to ambient | — | 65 | ° C./W |
| $T_J$ | Junction temperature | — | 150 | ° C. |
| $T_S$ | Storage temperature | −55 | 150 | |
| $T_L$ | Lead temperature (soldering, 10 seconds) | — | 300 | |

TABLE II

Operating Conditions for an Example of a Gate Driver Integrated Circuit

| Symbol | Definition | Min. | Max. | Units |
|---|---|---|---|---|
| $V_B$ | High side floating supply voltage (Note 1) | $V_S + 11.5$ | $V_S + 20$ | V |
| $V_S$ | High side floating supply offset voltage | | 1200 | |
| $V_{HO}$ | High side output voltage (HOP, HON and SSDH) | $V_S$ | $V_S + 20$ | |
| $V_{LO}$ | Low side output voltage (LOP, LON and SSDL) | $V_{COM}$ | $V_{CC}$ | |
| $V_{CC}$ | Low side and logic fixed supply voltage (Note 1) | 11.5 | 20 | |
| COM | Power ground | −5 | 5 | |
| $V_{IN}$ | Logic input voltage (HIN, LIN and FLT_CLR) | 0 | $V_{CC}$ | |
| $V_{FLT}$ | Fault input/output voltage (FAULT/SD and SY_FLT) | 0 | $V_{CC}$ | |
| $V_{DSH}$ | High side DS pin input voltage | $V_B - 20$ | $V_B$ | |
| $V_{DSL}$ | Low side DS pin input voltage | $V_{CC} - 20$ | $V_{CC}$ | |
| $T_A$ | Ambient temperature | −40 | 125 | ° C. |

TABLE III

R$_{Gon}$ Sizing

| IGBT | Q$_{ge}$ | Q$_{gc}$ | V$_{ge}$* | t$_{SW}$ | I$_{avg}$ | R$_{tot}$ | R$_{Gon}$ → std commercial value | t$_{SW}$ |
|---|---|---|---|---|---|---|---|---|
| IRGP30B120K(D) | 19 nC | 82 nC | 9 V | 400 ns | 0.25 A | 24 Ω | R$_{TOT}$ − R$_{DRp}$ = 12.7 Ω → 10 Ω | → 420 ns |
| IRG4PH30K(D) | 10 nC | 20 nC | 9 V | 200 ns | 0.15 A | 40 Ω | R$_{TOT}$ − R$_{DRp}$ = 32.5 Ω → 33 Ω | → 202 ns |

TABLE IV dV$_{OUT}$/dt Driven R$_{Gon}$ Sizing

| IGBT | Q$_{ge}$ | Q$_{gc}$ | V$_{ge}$* | CRES$_{off}$ | R$_{tot}$ | R$_{Gon}$ → std commercial value | dV$_{out/dt}$ |
|---|---|---|---|---|---|---|---|
| IRGP30B120K(D) | 19 nC | 82 nC | 9 V | 85 pF | 14 Ω | R$_{TOT}$ − R$_{DRp}$ = 6.5 Ω → 8.2 Ω | → 4.5 V/ns |
| IRG4PH30K(D) | 10 nC | 20 nC | 9 V | 14 pF | 85 Ω | R$_{TOT}$ − R$_{DRp}$ = 78 Ω → 82 Ω | → 5 V/ns |

TABLE V

R$_{Goff}$ Sizing

| IGBT | V$_{th}$ (min) | CRES$_{off}$ | R$_{Goff}$ | dV$_{out/dt}$ |
|---|---|---|---|---|
| IRGP30B120K(D) | 4 | 85 pF | R$_{Goff}$ ≤ 4 Ω | → 4.5 V/ns |
| IRG4PH30K(D) | 3 | 14 pF | R$_{Goff}$ ≤ 35 Ω | → 5 V/ns |

TABLE VI

Example Timing Values

Figure 7:
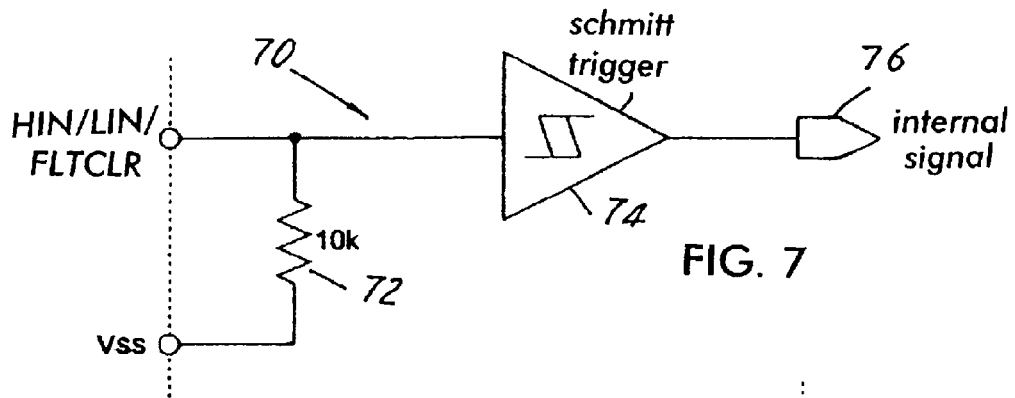
FIG. 7 shows a simplified diagram of the input and output of a Schmitt trigger circuit 70 as shown in FIG. 2.
Figure 8:
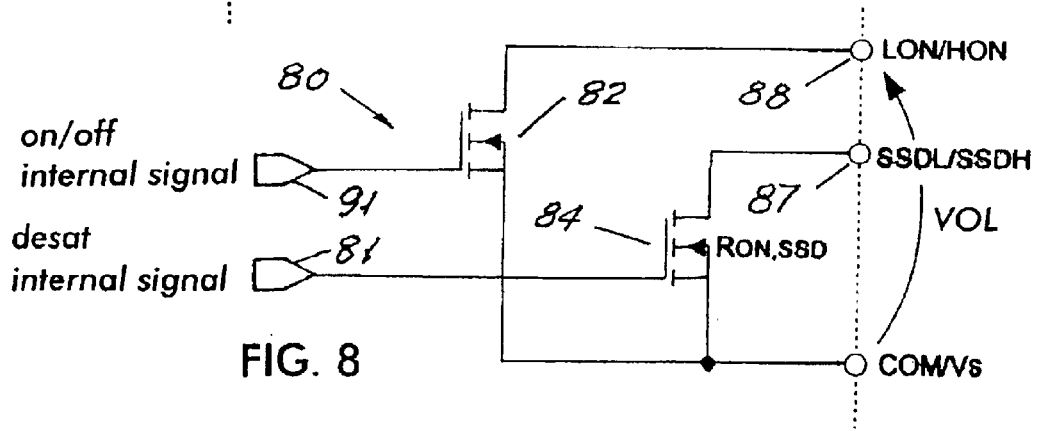
FIG. 8 shows one embodiment of the output circuit driving LON, HON, SSDH and SSDL of the high side and low side circuit drivers.
Figure 9:
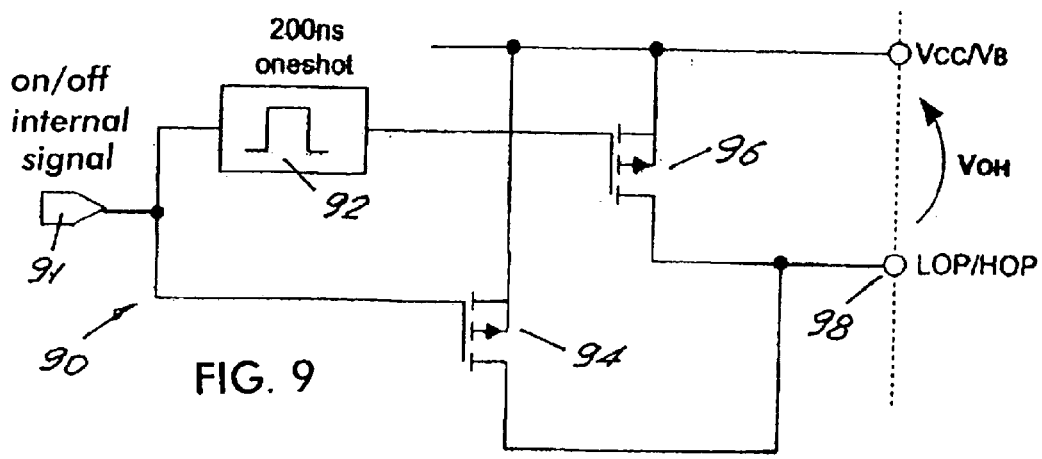
FIG. 9 shows the high side and low side circuit drivers for the LOP and HOP signals.
Figure 11:
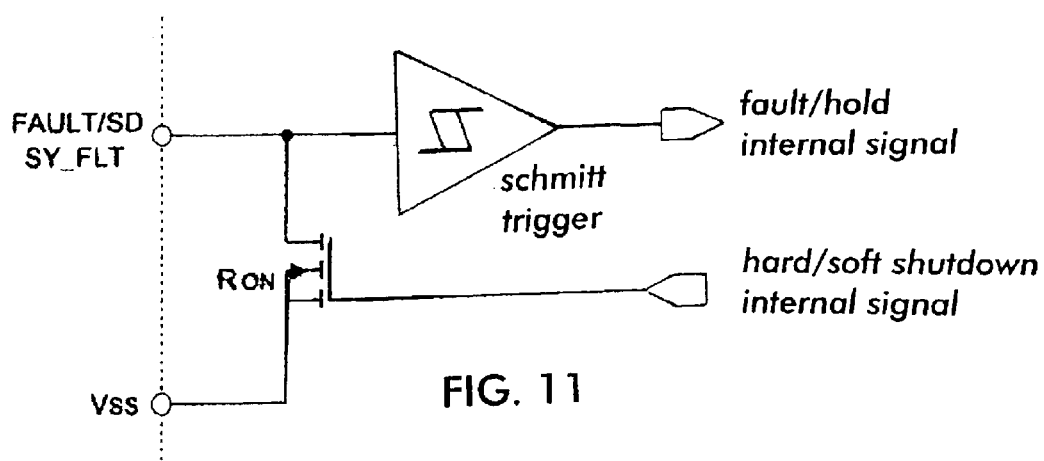
FIG. 11 shows generation of an internal fault hold signal and hard and soft shutdown internal signals based on inputs FAULT/SD and SY_FLT.
Figure 12:
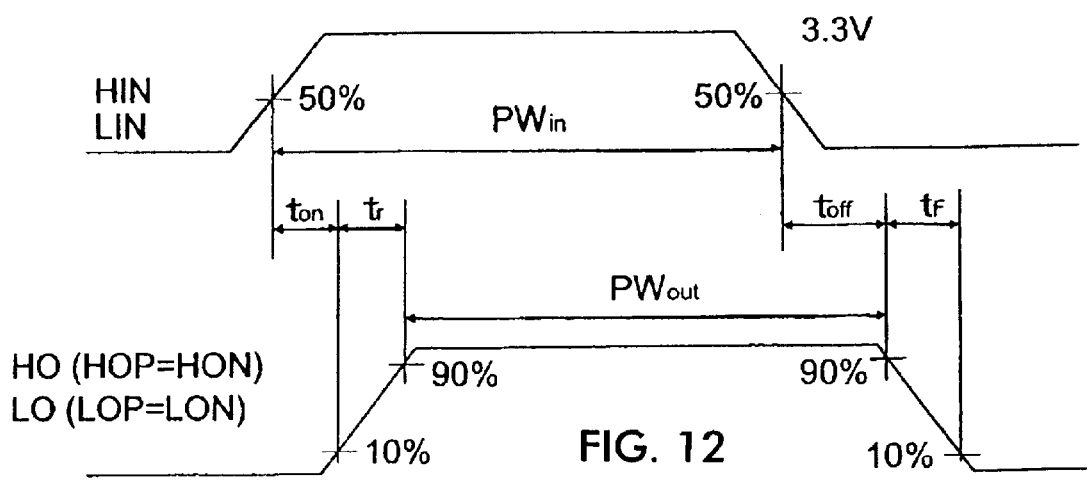
FIG. 12 shows the switching time waveforms of the high end low side circuit drivers.
Figure 13:
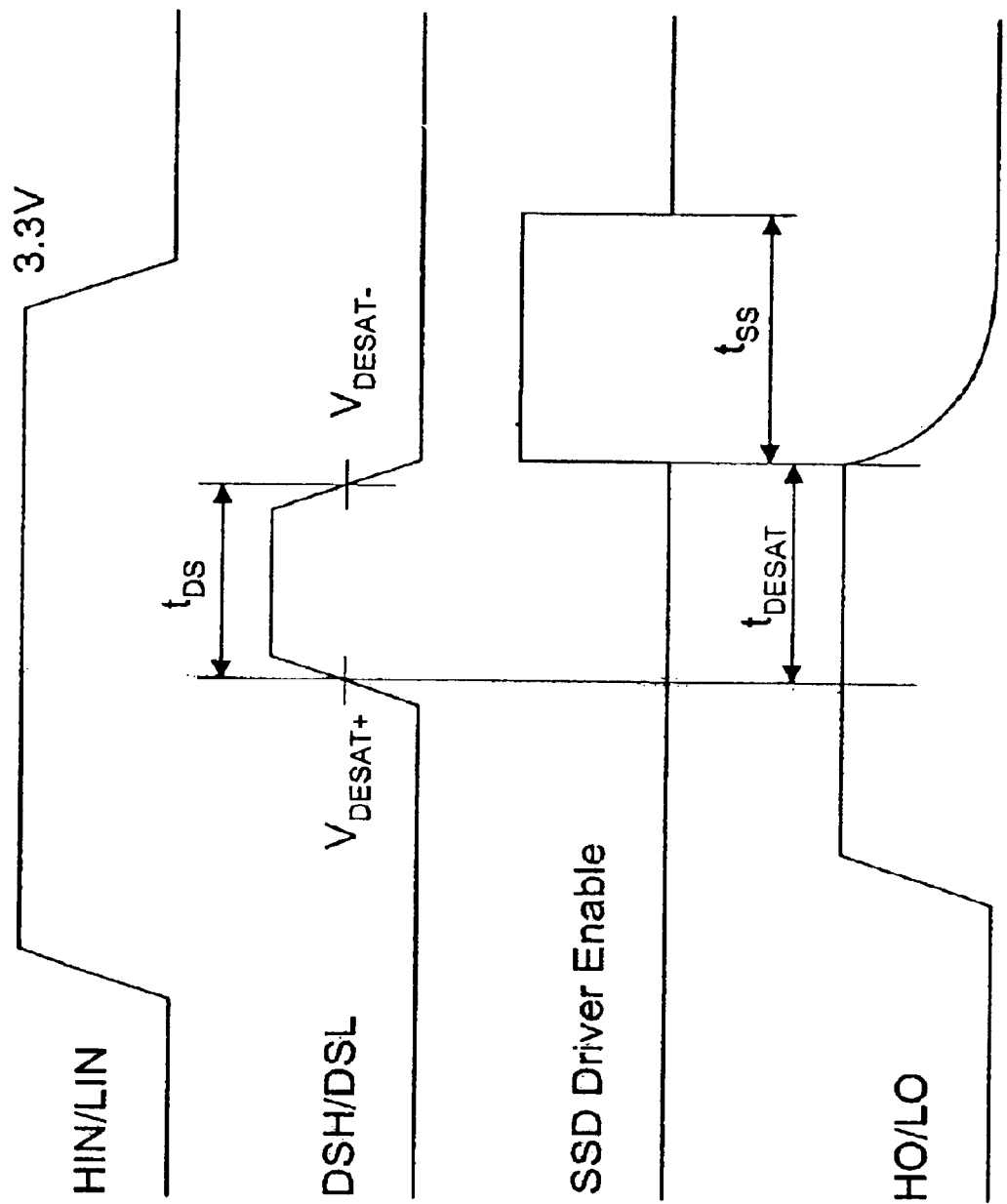
FIG. 13 shows the soft shutdown timing for the high side and low side circuit drivers.
Figure 14:
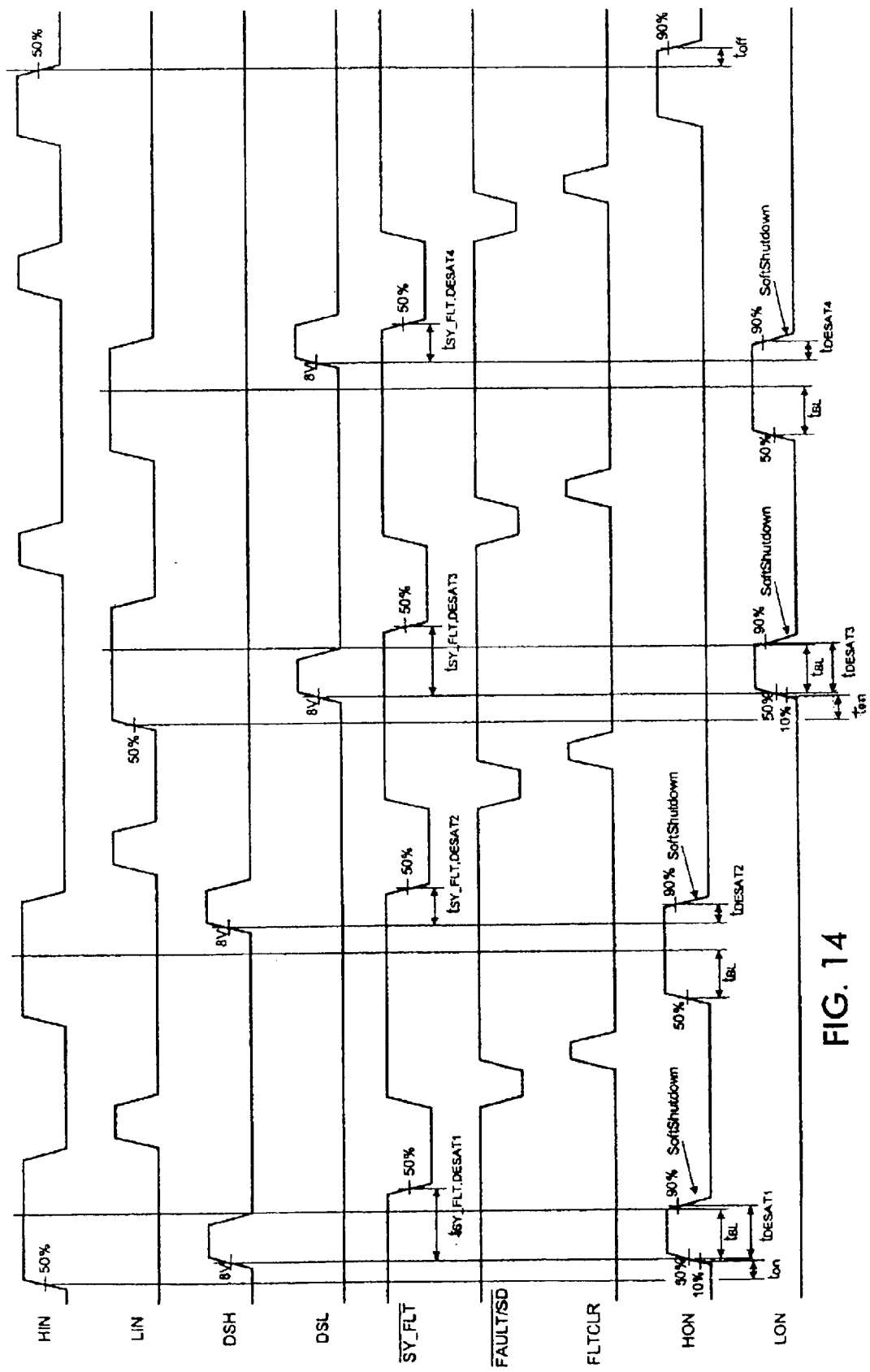
FIG. 14 shows a timing diagram for desat timing.
Figure 15:
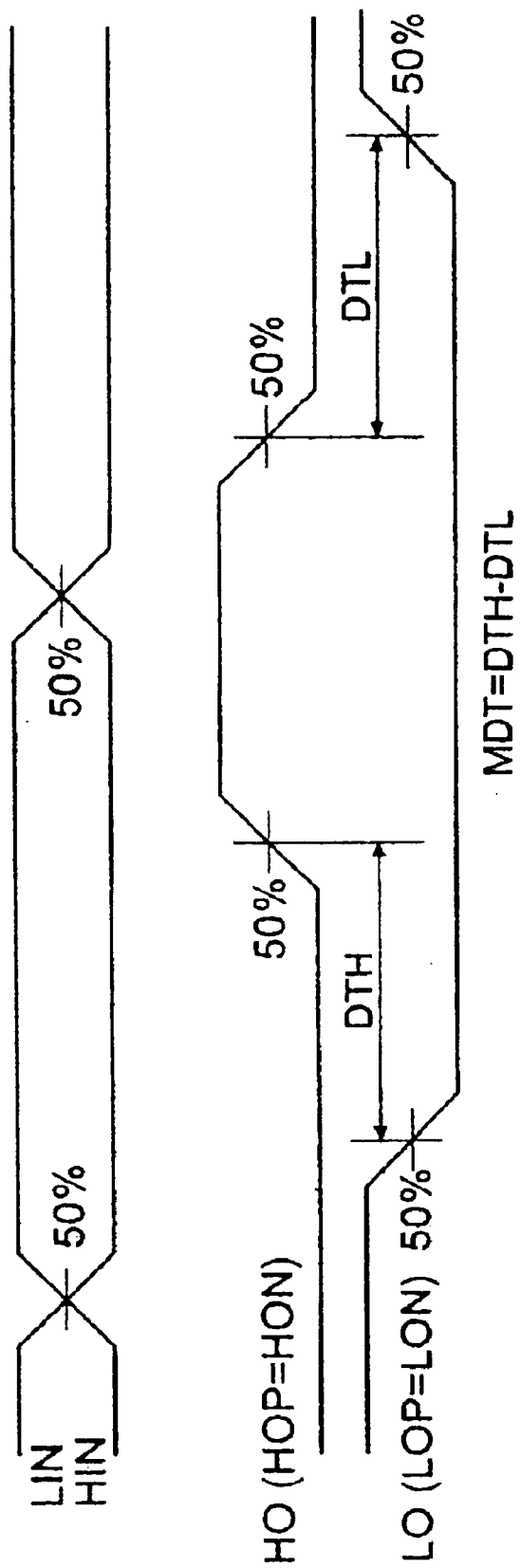
FIG. 15 shows a timing diagram for internal dead time timing.
Figure 16:
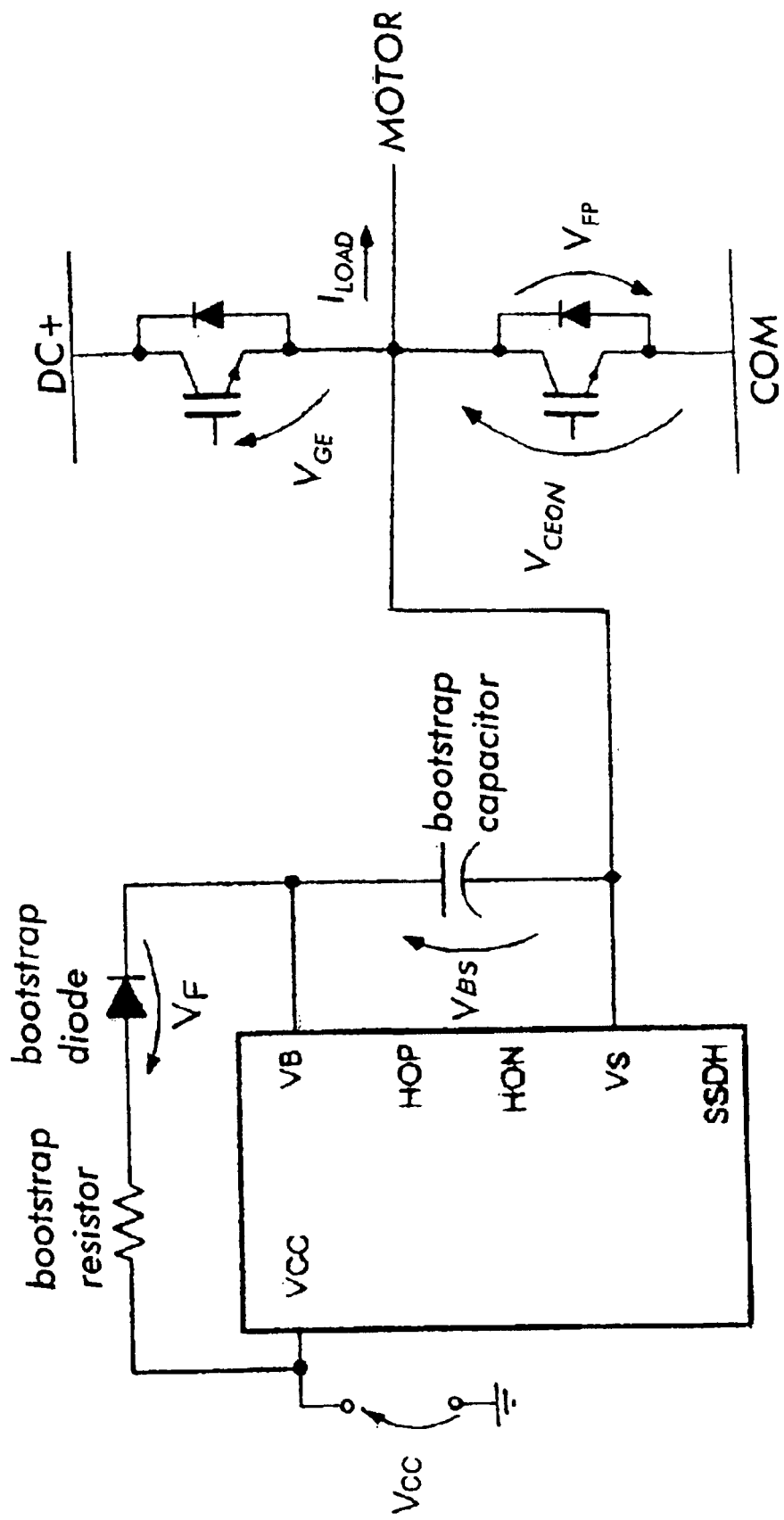
FIG. 16 shows an alternative embodiment of a bootstrap method of supplying the high side driver circuitry.

| Symbol | Definition | Min. | Typ. | Max. | Units | Test Conditions |
|---|---|---|---|---|---|---|
| t$_{on}$ | Turn on propagation delay | 220 | 440 | 660 | ns | V$_{IN}$ = 0 & 1 |
| t$_{off}$ | Turn off propagation delay | 220 | 440 | 660 | | V$_S$ = 0 to 1200 V |
| tr | Turn on rise time (C$_{LOAD}$ = 1 nF) | — | 24 | — | | HOP shorted to HON, |
| tf | Turn off fall time (C$_{LOAD}$ = 1 nF) | — | 7 | — | | LOP shorted to LON, FIG. 7, 10 |
| t$_{on1}$ | Turn on first stage duration time | 120 | 200 | 280 | | FIG. 8 |
| t$_{DESAT1}$ | DSH to HO soft shutdown propagation delay at HO turn on | 2000 | 3300 | 4600 | | V$_{HIN}$ = 1 V$_{DESAT}$ = 15 V, FIG. 10 |
| t$_{DESAT2}$ | DSH to HO soft shutdown propagation delay after Blanking | 1050 | — | — | | |
| t$_{DESAT3}$ | DSL to LO soft shutdown propagation delay at LO turn on | 2000 | 3300 | 4600 | | V$_{LIN}$ = 1 V$_{DESAT}$ = 15 V, FIG. 10 |
| t$_{DESAT4}$ | DSL to LO soft shutdown propagation delay after Blanking | 1050 | — | — | | |
| t$_{DS}$ | Soft shutdown minimum pulse width of desat | 1000 | — | — | | FIG. 9 |
| t$_{SS}$ | Soft shutdown duration period | 5700 | 9600 | 13500 | | C$_L$ = TBD μF, V$_{DS}$ = 15 V, FIG. 9 |
| tSY_FLT, DESAT1 | DSH to SY_FLT propagation delay at HO turn on | — | 3600 | — | | V$_{HIN}$ = 1 V$_{DS}$ = 15 V, FIG. 10 |
| tSY_FLT, DESAT2 | DSH to SY_FLT propagation delay after blanking | 1300 | — | — | ns | |
| tSY_FLT, DESAT3 | DSL to SY_FLT propagation delay at LO turn on | — | 3050 | — | | V$_{LIN}$ = 1 V$_{DESAT}$ = 15 V, FIG. 10 |
| tSY_FLT, DESAT4 | DSL to SY_FLT propagation delay after blanking | 1050 | — | — | | |
| t$_{BL}$ | DS blanking time at turn on | — | 3000 | — | | V$_{HIN}$ = V$_{LIN}$ = 1 V$_{DESAT}$ = 15 V, FIG. 10 |
| Dead-time/Delay Matching Characteristics | | | | | | |
| DT | Dead-time | — | 300 | — | | FIG. 11 |
| MDT | Dead-time matching, MDT = DTH − DTL | — | — | 75 | | External DT = 0 nsec FIG. 11 |
| PDM | Propagation delay matching, Max(t$_{on}$, t$_{off}$) = Min(t$_{on}$, t$_{off}$) | — | — | 75 | | External DT> 500 nsec, FIG. 7 |

V$_{CC}$ = V$_{BS}$ = 15 V,
VS = VSS and
TA = 25° C. unless otherwise specified.

What is claimed is:
1. A gate driver integrated circuit for switching a power transistor using an external supply voltage and an external controller, comprising:
   an output stage configured to be coupled to the power transistor and to detect a desaturation state of the power transistor and to execute a soft shutdown sequence to gradually shut down the power transistor, such that transient over-voltage of the power transistor is prevented during the soft shutdown sequence;

an input stage coupled to the output stage and configured to be coupled to the external controller via an external control input, the input stage being configured to control the output stage as a function of the external control input during normal operation; and a fault control circuit coupled to the output stage and the input stage, the fault control circuit being operable to place the input stage in a hold state during the soft shutdown sequence, such that the input stage ignores the external control input during the soft shutdown sequence, wherein the fault control circuit, the input stage and the output stage are integrated in the integrated circuit.

2. The integrated circuit of claim 1, further comprising an under-voltage protection circuit coupled to the fault control circuit and the under-voltage protection circuit being operable to detect an under-voltage state of the external supply voltage.

3. The integrated circuit of claim 2, wherein the fault control circuit is operably configured to initiate a shutdown of the output stage in response to the detection of the under-voltage state of the external supply voltage by the under-voltage protection circuit.

4. The integrated circuit of claim 3, wherein, during the soft shutdown sequence, the fault control circuit is operably configured to delay initiating the shutdown of the output stage in response to the detection of the under-voltage state of the external supply by the under-voltage protection circuit.

5. The integrated circuit of claim 1, wherein the output stage is coupled to the power transistor by an external sourcing connection, an external sinking connection and an external soft shutdown connection.

6. The integrated circuit of claim 4, wherein the fault control circuit is configured to be coupled to a dedicated local network, and the fault control circuit is operably configured to detect an external desaturation fault signal communicated on the dedicated local network.

7. The integrated circuit of claim 6, wherein the fault control circuit is operably configured to place the input stage in the hold state when the fault control circuit detects the external desaturation fault on the dedicated local network.

8. The integrated circuit of claim 7, wherein the fault control circuit is operably configured to communicate a desaturation fault signal on the dedicated local network during the soft shutdown sequence.

9. The integrated circuit of claim 8, wherein the dedicated local network is not connected to the external controller.

10. The integrated circuit of claim 9, wherein the fault control circuit is configured to be coupled to the dedicated local network using a common external desaturation fault signal input-output connection, such that the external desaturation fault signal communicated on the dedicated local network uses the common external desaturation fault signal input-output connection.

11. The integrated circuit of claim 10, wherein the fault control circuit is configured to be coupled to a shutdown fault network, the fault control circuit being operable to detect an external shutdown fault on the shutdown fault network and to communicate an external shutdown fault on the shutdown fault network.

12. The integrated circuit of claim 11, wherein, during the normal operation, the fault control circuit is operably configured to communicate an external shutdown fault signal on the shutdown fault network in response to the detection of the under-voltage state of the external supply voltage by the under-voltage protection circuit.

13. The integrated circuit of claim 12, wherein, during the soft shutdown sequence, the fault control circuit is configured to delay the communicating of the external shutdown fault signal in response to the detection of the under-voltage state of the external supply voltage by the under-voltage protection circuit, until the soft shutdown sequence is completed by the output stage.

14. The integrated circuit of claim 13, wherein the fault control circuit is configured to latch the external shutdown fault signal on the shutdown fault network after completion of any soft shutdown sequence.

15. The integrated circuit of claim 14, wherein the fault control circuit is configured to be operably coupled to the external controller, the fault control circuit operably detecting an external fault clear signal communicated by the external controller.

16. The integrated circuit of claim 17, wherein the fault control circuit is configured to unlatch the external shutdown fault signal, after the external shutdown fault signal is latched by the fault control circuit after the soft shutdown sequence is completed, only when the external fault clear signal is communicated by the external controller.

17. The integrated circuit of claim 16, wherein the external fault clear signal is an active high signal.

18. The integrated circuit of claim 17, wherein the external shutdown fault signal is an active low signal.

19. The integrated circuit of claim 17, wherein the external desaturation fault signal is active low, when asserted on the dedicated local network.

20. A gate driver integrated circuit for switching a first power transistor and a second power transistor using an external controller and an external supply voltage, the external supply voltage being capable of being bootstrapped from a floating supply voltage, the integrated circuit comprising:

a first output stage configured to be coupled to the first power transistor and to detect a desaturation state of the first power transistor and to execute a soft shutdown sequence of the first output stage to gradually shut down the first power transistor, such that a transient over-voltage of the first power transistor is prevented during the soft shutdown sequence;

a second output stage configured to be coupled to the second power transistor and to detect a desaturation state of the second output stage and to execute a soft shutdown sequence of the second power transistor to gradually shut down the second power transistor, such that transient over-voltage of the second power transistor is prevented during the soft shutdown sequence;

an input stage coupled to the first output stage and the second output stage and configured to be coupled to the external controller via a first external control input and a second external control input, and during normal operation, the input stage is configured to control the first output stage as a function of the first external control input and the second output stage as a function of the second external control input; and a fault control circuit coupled to the first output stage, the second output stage and the input stage, the fault control circuit being operable to place the input stage in a hold state during the soft shutdown sequence of the first output stage, the second output stage or both the first and second output stages, such that the input stage ignores the first external control input and the second external control input during the soft shutdown sequence of the first output stage, the second output stage or both the first and second output stages, wherein the fault control circuit, the input stage, the second output stage and the first output stage are integrated in the integrated circuit.

21. The integrated circuit of claim 20, further comprising:
a first under-voltage protection circuit coupled to the fault control circuit and the under-voltage protection circuit being operable to detect an under-voltage state of the external supply voltage, such that the fault control circuit is operably configured to initiate a shutdown of both the first output stage and the second output stage in response to the detection of the under-voltage state of the external supply voltage by the under-voltage protection circuit.

22. The integrated circuit of claim 21, further comprising:
a second under-voltage protection circuit coupled to the second output stage and configured to detect an under-voltage state of the floating supply voltage, such that the second output stage initiates a shutdown of the second output stage, when an under-voltage state of the floating supply voltage is detected.

23. The integrated circuit of claim 22, wherein the second under-voltage protection circuit and the second output stage are configured such that the first output stage continues to control the second power transistor and to generate diagnostic signals.

24. The integrated circuit of claim 23, wherein the fault control circuit manages fault states using three external fault connections, including a desaturation fault input-output connection configured to couple to a dedicated local network, a shutdown fault input-output connection configured to couple to a shutdown fault network including the external controller, and a fault clear input connection configured to couple to the external controller.

25. The integrated circuit of claim 24, wherein the fault control circuit is configured to detect the desaturation fault signal on the dedicated local network and the shutdown fault signal on the shutdown fault network.

26. The integrated circuit of claim 25, wherein the fault control circuit includes fault management logic such that the fault control circuit asserts a desaturation fault on the dedicated local network during the soft shutdown sequence of the first output stage, the second output stage or both the first and second output stages and latches active a shutdown fault on the shutdown fault network after the soft shutdown sequence of the first output stage, the second output stage or both the first and second output stages is completed, wherein assertion of the fault clear input by the external controller is required to unlatch the shutdown fault of the fault control logic.

27. The integrated circuit of claim 26, wherein the fault control circuit is configured such that the shutdown fault is asserted on the shutdown fault network, but not latched, during detection of an under-voltage state of the supply voltage by the first under-voltage protection circuit, and when a shutdown fault is asserted on the shutdown fault network, the fault control circuit detects the shutdown fault initiates a shutdown of the first output stage and the second output stage, unless the desaturation fault is asserted on the dedicated local network, wherein the desaturation fault takes priority over the shutdown fault.

28. The gate driver integrated circuit of claim 24, wherein the integrated circuit is configured such that an external bootstrap capacitor may be coupled to the second output stage and an external diode may be coupled between the output stage and the second under-voltage protection circuit, such that the external supply voltage is bootstrapped from the floating supply voltage, wherein the external supply voltage is fixed at a voltage greater than a minimum threshold voltage during the normal operation.

29. The gate driver integrated circuit of claim 28, wherein the floating supply voltage is capable of floating to 1200 Volts, and the first output stage is referenced to ground.

30. The gate driver integrated circuit of claim 29, wherein each of the power transistors are isolating gate bipolar transistors, and desaturation detection for each of the first output stage and the second output stage is suspended during a blanking time during transistor turn-on, wherein the blanking time is selected to be greater than the switching time, defined as the time spent to reach a plateau voltage for the isolating gate bipolar transistors.

31. The gate driver integrated circuit of claim 30, wherein the blanking time is no greater than 3 microseconds.

32. The gate driver integrated circuit of claim 30, wherein each of the output stages include a desaturation noise filter, such that the duration of the desaturation state must exceed a minimum pulse width before desaturation is detected.

33. The gate driver integrated circuit of claim 31, wherein the minimum pulse width is at least 1 microsecond.

34. A gate driver integrated circuit for switching a low side transistor and a high side transistor using an external logic supply voltage, an external floating supply voltage and an external controller, comprising:
an input stage configured to couple to the external controller, the external controller communicating a low side input signal and a high side input signal to the input stage, the input stage comprising an internal hold stage receiving a hold signal and an internal switching stage receiving a shutdown signal, the hold stage placing the input stage in a hold state when a hold signal is received, such that the low side input signal and the high side input signal are held by the hold stage, preventing further communication of the signals to the switching stage, the switching stage communicating a shutdown to both of the high side output stage and the low side output stage when the shutdown signal is received by the shutdown stage;
a level shifter coupled to the switching stage;
a high side output stage configured to be externally coupled to the high side transistor, the high side output stage being internally coupled to the level shifter to receive a high side switching signal, such that the high side transistor is switched on when the high side switching signal is received, the high side output stage comprising protection circuitry and a predriver, the predriver controlling switching of the high side transistor during normal operation, and the protection circuitry of the high side output stage operably detecting an under-voltage state of the high side supply voltage and a desaturation of the high side transistor, and the protection circuitry of the high side output stage shutting off the high side transistor when the under-voltage state of the high side supply voltage is detected and protecting the high side transistor when the desaturation of the high side transistor is detected, such that the high side transistor is gradually turned off, avoiding transient over-voltage states;
a low side output stage coupled to the switching stage to receive a low side switching signal and configured to be coupled to the low side transistor, such that the low side transistor is switched on when the low side switching signal is received by the low side output stage, the low side output stage comprising protection circuitry and a predriver, the predriver controlling switching of the low side transistor during normal operation, and the protection circuitry of the low side output stage detecting desaturation of the high side transistor, and the protection circuitry of the low side output stage protecting the high side transistor when desaturation of the high side transistor is detected such that the high side transistor is gradually turned off, avoiding transient over-voltage states;

a logic supply under-voltage protection circuit configured to detect an under-voltage state of the logic supply voltage and to communicate a logic supply under-voltage signal; and a fault control circuit, the fault control circuit is coupled to the hold stage, the switching stage, the low side output stage, the high side output stage, and the logic supply under-voltage protection circuit, and the fault control circuit is configured to be coupled to the external controller and an external dedicated local network, and the the fault control circuit is configured to manage signals received from the external controller, the external dedicated local network, the logic supply under-voltage protection circuit, the high side output stage and the low side output stage such that the fault control circuit communicates the internal hold signal to the input stage when a desaturation signal is communicated by one of the external dedicated local network, the high side output stage and the low side output stage, and only when the desaturation signal is communicated by one of the high side output stage and the low side output stage, the fault control circuit latches both the internal shutdown signal and an external shutdown signal when the desaturation protection is completed and communication of the desaturation signal is terminated, and when the external controller has communicated a fault clear signal to the fault control circuit, resetting the fault controller and no subsequent communication of the desaturation signal has been received from one of the external dedicated local network, the high side output stage and the low side output stage, the fault control network is configured to communicate the internal shutdown signal to the switching stage when the logic supply under-voltage signal is communicated by logic supply under-voltage protection circuit, initiating shutdown of both of the high side transistor and the low side transistor.

35. A multi-phase system of gate drivers for a multi-phase power supply using one gate driver integrated circuit of claim 28 for each phase of the multi-phase power supply.

* * * * *